United States Patent
Shimizu et al.

(10) Patent No.: US 7,778,612 B2
(45) Date of Patent: Aug. 17, 2010

(54) POLAR MODULATION CIRCUIT, INTEGRATED CIRCUIT AND RADIO APPARATUS

(75) Inventors: Yoshito Shimizu, Kanagawa (JP); Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 538 days.

(21) Appl. No.: 11/912,169

(22) PCT Filed: Apr. 17, 2006

(86) PCT No.: PCT/JP2006/308055

§ 371 (c)(1),
(2), (4) Date: Oct. 22, 2007

(87) PCT Pub. No.: WO2006/118015

PCT Pub. Date: Nov. 9, 2006

(65) Prior Publication Data

US 2009/0023402 A1    Jan. 22, 2009

(30) Foreign Application Priority Data

Apr. 26, 2005 (JP) .............................. 2005-128207
Apr. 11, 2006 (JP) .............................. 2006-108997

(51) Int. Cl.
*H04B 1/04* (2006.01)
*H04B 1/62* (2006.01)

(52) U.S. Cl. .................................... 455/114.3; 455/102

(58) Field of Classification Search .................. 455/91, 455/102, 108, 110, 114.2, 114.3, 115.1, 116, 455/126, 127.1, 127.2

See application file for complete search history.

(56) References Cited

U.S. PATENT DOCUMENTS

| 6,377,784 B2* | 4/2002 | McCune ................. 455/108 |
| 6,834,084 B2* | 12/2004 | Hietala ................. 375/296 |
| 7,535,310 B2* | 5/2009 | Shimizu et al. .......... 332/103 |
| 7,545,880 B1* | 6/2009 | Coons et al. ........... 375/296 |
| 7,689,182 B1* | 3/2010 | Bosley et al. ........... 455/127.1 |
| 2004/0266366 A1* | 12/2004 | Robinson et al. ........ 455/91 |

FOREIGN PATENT DOCUMENTS

| JP | 2000-201099 | 7/2000 |
| JP | 2002-135349 | 5/2002 |
| JP | 2004-501527 | 1/2004 |
| WO | 03-073604 | 9/2003 |

OTHER PUBLICATIONS

International Search Report Dated Jul. 25, 2006.
High Linearity RF Amplifier Design.

\* cited by examiner

*Primary Examiner*—Blane J Jackson
(74) *Attorney, Agent, or Firm*—Pearne & Gordon LLP

(57) ABSTRACT

An object of the invention is to provide a polar modulation circuit capable of reducing the capacity of data stored in memory and suppressing an increase in the circuit scale related to distortion compensation while assuring the compensation accuracy. The polar modulation circuit according to the invention stores output signal characteristic relative to the control voltage at the steady state after input of the control voltage for a predetermined input amplitude of an input high frequency signal as the basis of distortion compensation of an amplifier separately into an offset storage section 101a which stores data used to add a predetermined DC offset voltage and a coefficient storage section 102 which stores data used for multiplication by a predetermined constant, thus reducing the circuit scale related to distortion compensation while assuring the compensation accuracy.

20 Claims, 21 Drawing Sheets

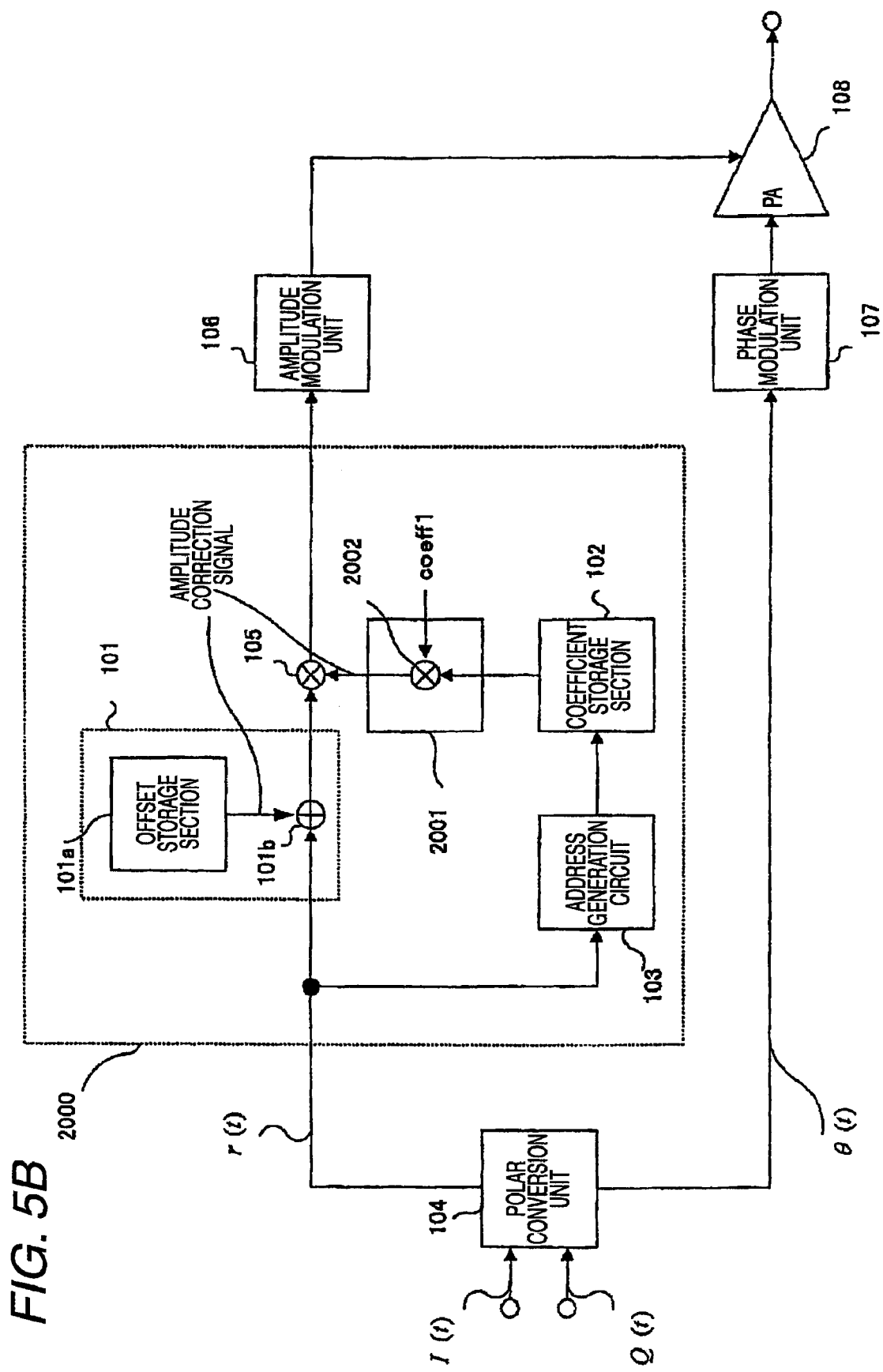

FIG. 17

| AMPLITUDE VALUE (a) | ADDRESS VALUE (b) |
|---|---|
| a[0] | b[0] |
| a[1] | |
| a[2] | |
| a[3] | |
| a[4] | |
| a[5] | |
| a[6] | |
| a[7] | |
| a[8] | b[1] |
| a[9] | |
| a[10] | |
| a[11] | |
| a[12] | |
| a[13] | |
| a[14] | |
| a[15] | b[2] |
| a[16] | |
| a[17] | |
| a[18] | |
| a[19] | |
| a[20] | |
| a[21] | b[3] |
| a[22] | |
| a[23] | |
| a[24] | |
| a[25] | |
| a[26] | b[4] |
| a[27] | |
| a[28] | |
| a[29] | |
| ⋮ | ⋮ |

FIG. 18

| ADDRESS VALUE(b) | CORRECTION SIGNAL |
|---|---|
| b[0] | [0] |
| b[1] | [1] |
| b[2] | [2] |
| b[3] | [3] |
| b[4] | [4] |
| ⋮ | ⋮ |

POLAR MODULATION CIRCUIT, INTEGRATED CIRCUIT AND RADIO APPARATUS

TECHNICAL FIELD

The present invention relates to a polar modulation circuit including a distortion compensation circuit for compensating for distortion of an output signal from an amplifier and an integrated circuit and radio apparatus including the polar modulation circuit.

BACKGROUND ART

In cell phone services in recent years, enhancement of communication speed is getting more critical with a growing demand for data communications on top of voice communications. For example, in the GSM (Global System for Mobile communications) system in widespread use mainly in the European and Asian regions, voice communications have conventionally employed GMSK modulation that shifts the phase of a carrier in accordance with transmit data. Further, The EDGE (Enhanced Data rates for GSM Evolution) system has been proposed whereby data communications are also performed with $3\pi/8$ rotating 8-PSK modulation (hereinafter referred to as 8-PSK modulation) including threefold bit information per symbol compared with GMSK modulation by shifting the phase and amplitude of a carrier in accordance with transmit data.

In a linear modulation system accompanied by amplitude fluctuation such as 8-PSK modulation, request for linearity of a PA (Power Amplifier) in a radio apparatus transmitter is rigorous. In general, power efficiency in the linear region of a power amplifier is lower than power efficiency in the saturation region. Thus, it has been difficult to provide high efficiency when related art quadrature modulation is applied to the linear modulation system.

(High Efficiency Attained by the Polar Modulation System)

Therefore a system for synthesizing amplitude modulations is known. This system includes steps of: dividing a transmit signal into a constant-amplitude phase signal and an amplitude signal; phase-modulating the transmit signal based on the constant-amplitude phase signal by using a phase modulator; and inputting a constant-amplitude phase modulation signal at the level a power amplifier performs saturation operation and driving a control voltage for the power amplifier at high speed. This system is referred to as the EER method (Envelope Elimination and Restoration) or polar modulation (polar modulating system or polar modulation system) and provides high efficiency of a power amplifier by way of the linear modulation system (for example, refer to Non-Patent Reference 1). In the description that follows, this system is called the polar modulation system in order to make it clear that the system is different from the quadrature modulation system.

FIG. 10 is a drawing where 8-PSK modulation signals used in the EDGE system are plotted on an IQ orthogonal coordinates. FIG. 11 is a drawing where amplitude component of the 8-PSK modulation signals in the 200 to 400 [μs] section extracted from one time-slot (577 [μs]) of GSM are plotted. In FIG. 11, the horizontal axis represents a time that has elapsed from the beginning of the time slot and the vertical axis the amplitude of an amplitude signal.

In order to represent an amplitude signal including a inflection points for the maximum value and minimum value of amplitude within 2 [μs] as shown in FIG. 11, a distortion compensation technique is indispensable to enhance the output response used for high-speed driving of a control voltage of a power amplifier.

(Distortion Compensation in the Polar Modulation System: Pre-Distortion System)

In a related art example of distortion compensation technique for enhancing the output response of a power amplifier in the polar modulation system, the control voltage characteristics of output signal amplitude and passing phase obtained beforehand in a saturation operation type power amplifier for a predetermined high frequency signal amplitude are stored into memory and distortion compensation of the pre-distortion system is performed while referencing the memory (for example, refer to Patent Reference 1).

FIG. 12 is a block diagram of related art polar modulation apparatus to which distortion compensation of the pre-distortion system described in Patent Reference 1 is applied. As shown in FIG. 12, the polar modulation apparatus comprises a power amplifier 1100, polar modulation unit 1101, a memory 1102, an amplitude controller 1105 including amplitude information correction unit 1103 and amplitude modulation unit 1104, and a phase modulation signal generator 1108 including phase information correction unit 1106 and phase modulation unit 1107.

The polar conversion unit 1101 separates an IQ signal input from a baseband signal generator section (not shown) into an amplitude signal r(t) and a phase signal θ(t) of a constant amplitude. Although not described in Patent Reference 1, normalization may be done so that r(t) have a maximum value of 1.

The memory 1102 stores the positive characteristics of an output signal amplitude characteristic (AM-AM: Amplitude Modulation to Amplitude Modulation conversion) and passing phase characteristic (AM-PM: Amplitude Modulation to Phase Modulation conversion) relative to an input control signal of the power amplifier 1100 for a predetermined input high frequency signal amplitude. The memory 1102 then outputs an amplitude correction signal and a phase correction signal having the inverse characteristic of the power amplifier 1100 in accordance with the input amplitude signal r(t). The inverse characteristic refers to a multiple of the inverse function of a positive characteristic by a predetermined constant.

The amplitude information correction unit 1103 corrects the input amplitude signal r(t) based on the amplitude correction signal output from the memory 1102. The amplitude modulation unit 1104 drives the control voltage for the power amplifier 1100 at high speed based on an output signal from the amplitude information correction unit 1103.

The phase information correction unit 1106 corrects the input phase signal based on the phase correction signal output from the memory 1102. The phase modulation unit 1107 performs phase modulation based on an output signal from the phase information correction unit 1106.

In this way, in consideration of the inverse characteristic of the output characteristic relative to the input control signal of a power amplifier, the pre-distorted amplitude modulation signal and phase modulation signal have desired output amplitude and phase influenced by actual amplitude compression (AM-AM distortion) and cross modulation (AM-PM distortion) generated by the power amplifier. This enhances the output response (linearity) to the input control voltage.

(AM-AM Characteristic in a Polar Modulation System: not Passing Through the Origin)

Although not disclosed in Patent Reference 1, an example of characteristic stored in the memory 1102 will be described. The data for AM-AM characteristic compensation stored in the memory 1102 is created based on the output signal amplitude characteristic (AM-AM) for the input control signal under the conditions that the input high frequency signal amplitude is constant. The data is obtained at the time the output signal amplitude is stabilized after the control signal is input. The AM-AM characteristic is represented by a curve that does not pass through the origin even when the linear region is extended, that is, a curve shown by the solid line in FIG. 13 in some device structure of a power amplifier.

In FIG. 13, the horizontal axis represents a control voltage applied to the power amplifier 1100 and the vertical axis an output voltage from the power amplifier 1100. The curve (A) shown by a solid line in the figure represents the output voltage characteristic of a fundamental frequency obtained in case a predetermined control voltage is applied. The straight line (A) shown by a dotted line represents the characteristic of an extended linear region of the curve.

Thus, the data stored in the memory 1102 for AM-AM characteristic compensation corresponds to points sampled at predetermined intervals of the curve (A) shown by the solid line in FIG. 13 (intersection of straight lines normal to the vertical axis and the curve).

Next, an example of distortion compensation processing in a polar modulation apparatus to which distortion compensation of pre-distortion system (AM-AM characteristic) is applied is shown in FIG. 14. With taking the amplitude signal shown in FIG. 11 as an example, FIG. 14 shows the relationship between a control voltage and an amplitude signal used to find a control voltage to be applied to the power amplifier 1100 when an amplitude signal is represented by the inverse characteristic of the output signal amplitude characteristic (AM-AM) for the input control signal shown in FIG. 13, that is, by the output of the power amplifier 1100.

In FIG. 14, the horizontal axis represents the control voltage applied to the power amplifier 1100 and the vertical axis the output voltage from the power amplifier 1100. The curve (A) shown by a solid line in the figure represents the output voltage characteristic of a fundamental frequency obtained in case a predetermined control voltage is applied. The straight line (A) shown by a dotted line represents a characteristic of an extended linear region of the curve.

In case the sampling interval of data stored in memory is narrow relative to the output signal amplitude characteristic (AM-AM) for the input control signal in FIG. 13 or 14, it is possible to accurately represent the amplitude signal, that is, ensure compensation accuracy with a tradeoff that the capacity of data stored in memory increases. In case the sampling interval of data stored in memory is broad, it is possible to reduce the capacity of data stored in memory with a tradeoff that the compensation accuracy is degraded.

Thus, in distortion compensation of the pre-distortion system, it is important to reduce the capacity of data stored in memory while assuring the compensation accuracy. It is also important to suppress an increase in the circuit scale related to distortion compensation.

(Distortion Compensation in a Quadrature Modulation System 1: Setting a Broad Sampling Interval of a Linear Region)

In a first exemplary related art method for reducing the capacity of data stored in memory while assuring the compensation accuracy with respect to distortion compensation of the pre-distortion system (AM-AM characteristic) in the quadrature modulation system, a broad sampling interval of compensation data is set to a region where the characteristic of the power amplifier is linear while a narrow sampling interval of compensation data is set to a region where the characteristic of the power amplifier is nonlinear. In this approach, the input signal is converted to addresses used for access to memory (for example, refer to Patent Reference 2).

FIG. 15 is a block diagram showing a related art distortion compensation circuit of the pre-distortion system in the quadrature modulation system described in Patent Reference 2. As shown in FIG. 15, a distortion compensation circuit 1400 comprises an amplitude component extraction circuit 1401, a memory 1402, correction unit 1403 and an address calculation circuit 1404.

(AM-AM Characteristic in a Quadrature Coordinate Modulation System: Passing Through the Origin)

The amplitude extraction circuit 1401 extracts the amplitude component (amplitude value (a)) of a modulating signal from the IQ signal input by a baseband signal generator (not shown). The memory 1402 stores the positive characteristics of the output amplitude characteristic (AM-AM) for the input high frequency signal and passing phase characteristic (AM-PM) for the input high frequency signal of a power amplifier shown by the solid line and dotted line in FIG. 16 under the conditions that the control voltage is constant. The memory 1402 then outputs a correction signal of the inverse characteristic of the power amplifier in accordance with an address value (b) output from the address calculation circuit 1404.

In FIG. 16, the horizontal axis represents the amplitude of an input high frequency signal, the vertical axis (left) the amplitude of an output signal, and the vertical axis (right) the phase rotation volume (passing phase) of the output signal with respect to the input high frequency signal as a reference. In general, the change in the passing phase is small in the linear region of the output signal amplitude characteristic relative to the input high frequency signal and is large in the nonlinear region.

The correction unit 1403 corrects an IQ signal input from a baseband signal generator (not shown) based on the correction signal. The address calculation circuit 1404 obtains an address value (b) as a reference value used in an access to data stored in the memory 1402, from the amplitude value (a) output from the amplitude component extraction circuit 1401.

In distortion compensation of the pre-distortion system in a quadrature modulation system, a multiplication circuit for performing complex multiplication as correction unit 1403 is typically used. The multiplication circuit multiplies the IQ signal input from the baseband signal generator (not shown) by a correction signal as an inverse characteristic of a power amplifier.

In case a characteristic curve passes through the origin such as the case of the output signal amplitude characteristic (AM-AM) for the input high frequency signal as shown by a solid line in FIG. 16, a multiplier coefficient by which an amplitude component is multiplied is constant and a change in the passing phase (AM-PM) is small in a linear region where the gradient is constant. Thus, it is possible to broaden the sampling interval of correction data stored in the memory 1402 compared with the sampling interval in a nonlinear region without degrading the compensation accuracy.

The memory 1402 uses the above relationship to broaden the sampling interval in a linear region and narrows the sampling interval in a nonlinear region to store correction data. The address calculation circuit 1404 performs conversion of sampling intervals in order to compensate for inconstancy of sampling interval of data stored in the memory 1402.

The above conversion processing will be described referring to FIGS. 17 and 18 described in Patent Reference 2. FIG. 17 shows the conversion processing of sampling interval in the address calculation circuit 1404 described in Patent Reference 2.

In FIG. 17, the left column shows amplitude values (a) output from the amplitude component extraction circuit 1401 and sampled at constant intervals. The right column shows address values (b) output to the memory 1402, with plural amplitude values (a) corresponding to a single address value (b).

FIG. 18 shows an example of correction signal stored in the memory 1402. In FIG. 18, the left column shows address values (b) output from the address calculation circuit 1404 and the right column shows correction signals to be output to the correction unit 1403.

As shown in FIG. 17, by retaining as a table the correspondence between amplitude values (a) and address values (b), formulating the correspondence or making judgment of conditions for the correspondence, it is possible to convert sampling intervals. As shown in FIG. 18, the compensation data volume stored in the memory 1402 is smaller than that obtained when sampling is made at constant intervals in both the linear and nonlinear regions.

(Distortion Compensation in a Quadrature Modulation System 2: Storing a Difference from an Approximation Function into Memory)

In a second exemplary related art method for reducing the capacity of data stored in memory while assuring the compensation accuracy with respect to distortion compensation of the pre-distortion system (AM-AM characteristic) in a quadrature modulation system, any portion of the output signal amplitude characteristic (AM-AM) relative to the input high frequency signal of a power amplifier that may be subjected to linear function approximation is approximated as such, and a difference between the approximation function and the original characteristic is stored into memory (for example, refer to Patent Reference 3).

FIG. 19 is a block diagram showing a related art distortion compensation circuit of the pre-distortion system in the quadrature modulation system described in Patent Reference 3. As shown in FIG. 19, the distortion compensation circuit comprises a polar conversion unit 1101, an adder circuit 1103 as amplitude information correction unit, a phase information correction unit 1106, an approximation function adder section 1801, and a memory 1802. Although not shown, an output amplitude signal from the adder circuit 1103 is synthesized with an output phase signal from the phase correction unit 1106 and the resulting composite signal is converted to an IQ signal format again. The re-converted IQ signal is input to a quadrature modulator (not shown). Thus, similarly to the data stored in the memory 1402 shown in FIG. 15, the data stored in the memory 1802 is the positive characteristics of the output amplitude characteristic (AM-AM) and passing phase characteristic (AM-PM) relative to the input high frequency signal of a power amplifier under the conditions that the control voltage is constant.

The relationship between the input signal r(t) and the output signal r2(t) in the approximation function adder section 1801 is represented by the expression:

$$r2(t) = A \times r(t) + B.$$

For the same portion as that in FIG. 12 that explains related art polar modulation apparatus to which distortion compensation of the pre-distortion system is applied that is described in Patent Reference 1, the same signs are given and corresponding description is omitted.

FIG. 20 shows the roles of the approximation function adder section 1801 and the memory 1802 described in Patent Reference 3. In FIG. 20, the horizontal axis represents the amplitude of an input high frequency signal and the vertical axis the amplitude of an output signal. The solid line in FIG. 20 represents the inverse characteristic of the output signal amplitude characteristic (AM-AM) relative to the input high frequency signal of a power amplifier. The dotted line shows an approximation function represented by a linear function (y=Ax+B, B=0) and added in the approximation function adder section 1801. The memory 1802 stores a difference between the inverse characteristic of AM-AM and the approximation function.

In this way, by using both the linear function approximation in the approximation function adder section 1801 and storage of a difference data between the desired characteristic and the approximation function into the memory 1802, it is possible to reduce compensation data in a linear region that can be represented by an approximation function stored in the memory 1802. This reduces the capacity of data stored in the memory 1802 compared with a case where the correction data in all regions including the linear region into the memory 1802.

Patent Reference 1: JP-T-2004-501527 (FIG. 10)
Patent Reference 2: JP-A-2002-135349 (FIGS. 1, 2)
Patent Reference 3: JP-A-2000-201099 (FIGS. 1, 3a, 3b)
Non-Patent Reference 1: Kenington, Peter B, "High-Linearity RF Amplifier Design", Artech House Publishers (FIG. 7.1, Page 427)

DISCLOSURE OF THE INVENTION

Problems that the Invention is to Solve

In this way, in the distortion compensation of the pre-distortion system (AM-AM characteristic) in the quadrature modulation system, when the linear region of the AM-AM characteristic as a source of compensation data is extended, the characteristic curve passes through the origin as described earlier. In the distortion compensation of the pre-distortion system (AM-AM characteristic) in the polar modulation system, the characteristic curve does not pass through the origin even when the linear region of the AM-AM characteristic as a source of compensation data is extended as described earlier and an offset component is included.

Thus, in order to apply the distortion compensation of the pre-distortion system (AM-AM characteristic) in the quadrature modulation system to the polar modulation system, correction of the offset component is critical. Further, in the distortion compensation of the pre-distortion system, it is important to reduce the capacity of data stored in memory as well as suppress an increase in the circuit scale related to distortion compensation while assuring the compensation accuracy.

According to the first related art distortion compensation circuit of the pre-distortion system in the quadrature modulation system described in Patent Reference 2, a broad sampling interval of compensation data is set to a linear region of the AM-AM characteristic of a power amplifier while a narrow sampling interval of compensation data is set to a nonlinear region. This reduces the capacity of data stored in memory while assuring the compensation accuracy.

Each of an approach using a table, an approach for formulation, and an approach of threshold determination in conversion of sampling intervals could increase in the circuit scale related to distortion compensation except for memory. In addition, since the polar modulation system is out of consideration, no methods for correcting the offset voltage are described in Patent Reference 2. It is thus difficult to apply to the polar modulation system.

According to the second related art distortion compensation circuit of the pre-distortion system in the quadrature modulation system described in Patent Reference 3, linear function approximation representing the linear region of a power amplifier is applied to both the linear and nonlinear regions. For the nonlinear region alone, difference value data for correction of errors between the nonlinear region and the approximate linear function is stored into memory and added to an input signal. This reduces the capacity of data stored in memory while assuring the compensation accuracy.

Since this related art example does not consider the polar modulation system, a method for correcting the offset voltage is not described. However, it is possible to suppress an increase in memory by providing an optimum approximation function for a curve with an offset voltage.

However, in the polar modulation system, the approximation function is a linear function with an intercept (B) not equal to zero under the influence of the offset voltage in the AM-AM characteristic, so that the difference value data must be added. Thus, the arithmetic operation in an AM-AM characteristic compensation section requires at least two-time addition process and one-time multiplication process. This leads to a larger circuit scale related to arithmetic operation.

As shown in FIG. 19, in the approximation function adder section 1801, assuming that an input signal is r(t), an output signal is r2(t), an inclination is A, and an intercept is B ($\neq$0), an approximation function r2(t)=A×r(t)+B is a linear function with the intercept (B) not equal to 0. Thus, the input signal (r(t)) is multiplied by the inclination A and the intercept B is added to the result. The difference value data stored in the memory 1802 must be added. This results in a greater processing load.

Further, concerning the related art polar modulation apparatus with distortion compensation of the pre-distortion system applied described in Patent Reference 1, neither a particular distortion compensation method nor a method for reducing the capacity of data stored in memory is disclosed.

The invention has been accomplished in view of the foregoing circumstances. An object of the invention is to provide a polar modulation circuit, an integrated circuit and radio apparatus including a distortion compensation circuit of the pre-distortion system capable of reducing the capacity of data stored in memory and suppressing an increase in the circuit scale related to distortion compensation while assuring the compensation accuracy in the polar modulation system.

Means for Solving the Problems

The invention provides a polar modulation circuit comprising: a phase modulating section which generates a phase modulation signal based on a signal having at least a phase component in a baseband orthogonal signal generated from transmit data; an offset storage section which stores a DC offset of an output signal characteristic (AM-AM characteristic) relative to a control voltage in a steady state of an amplifier driven with a predetermined input high frequency signal amplitude value and a predetermined control voltage value; a coefficient storage section which stores a coefficient of the output signal characteristic; a first arithmetic circuit which adds or subtracts the DC offset stored in the offset storage section to/from an amplitude component of the baseband orthogonal signal; a second arithmetic circuit which multiplies or divides an output signal from the first arithmetic circuit by the coefficient stored in the coefficient storage section; an amplitude modulation section which generates an amplitude modulation signal based on an output signal from the second arithmetic circuit; and an amplifying section which synthesizes distortion-corrected transmit data by inputting the phase modulation signal as an input high frequency signal and inputting the amplitude modulation signal as a control signal.

With this configuration, it is possible to compensate for distortion of an output signal from the amplifying section by way of a one-time process of adding or subtracting a DC offset stored in the offset storage section to/from the output signal and a one-time process of multiplying or dividing the output signal by a coefficient stored in the coefficient storage section. This suppresses an increase in the circuit scale related to distortion compensation while assuring the compensation accuracy.

The invention provides a polar modulation circuit comprising: a phase modulation section which generates a phase modulation signal based on a signal having at least a phase component in a baseband orthogonal signal generated from transmit data; an offset storage section which stores a DC offset of output signal characteristic (AM-AM characteristic) relative to a control voltage in a steady state of an amplifier driven with a predetermined input high frequency signal amplitude value and a predetermined control voltage value; a coefficient storage section which stores a coefficient of the output signal characteristic; a first arithmetic circuit which multiplies or divides an amplitude component of the baseband orthogonal signal by the coefficient stored in the coefficient storage section; a second arithmetic circuit which adds or subtracts the DC offset stored in the offset storage section to/from an output signal from the first arithmetic circuit; an amplitude modulation section which generates an amplitude modulation signal based on an output signal from the second arithmetic circuit; and an amplifying section which synthesizes distortion-corrected transmit data by inputting the phase modulation signal as an input high frequency signal and inputting the amplitude modulation signal as a control signal.

With this configuration, it is possible to compensate for distortion of an output signal from an amplifier by way of a one-time process of adding or subtracting a DC offset to/from the output signal and a one-time process of multiplying or dividing the output signal by a coefficient. This suppresses an increase in the circuit scale related to distortion compensation while assuring the compensation accuracy.

The invention provides the polar modulation circuit wherein the coefficient storage section stores inclinations of respective linear functions as the coefficients, and the linear functions are approximated with an intercept fixed as the DC offset.

With this configuration, it is possible to adjust the inclination of a linear function for distortion compensation of a steady characteristic stored in a coefficient storage section in accordance with a desired output level.

The invention provides the polar modulation circuit further comprising an address generation circuit which generates an address signal for specifying an address in the coefficient storage section in which the coefficients corresponding to the amplitude of the baseband orthogonal signal are stored, wherein the address generation circuit specifies a fixed address in a case that an amplitude of the baseband orthogonal signal represents linear region of the output signal characteristic.

With this configuration, it is possible to efficiently store data into a coefficient storage section since only one point of compensation data (coefficient) is required to represent a linear region.

The invention provides the polar modulation circuit wherein the offset storage section stores intercepts of respective linear functions as the DC offset, and the linear functions are approximated with an inclination fixed as the coefficient.

With this configuration, it is possible to adjust the intercept of a linear function for distortion compensation of a steady characteristic stored in an offset storage section.

The invention provides the polar modulation circuit further comprising an address generation circuit which generates an address signal for specifying an address in the coefficient storage section in which the DC offset corresponding to the amplitude of the baseband orthogonal signal is stored, wherein the address generation circuit specifies a fixed address in a case that an amplitude of the baseband orthogonal signal represents linear region of the output signal characteristic.

With this configuration, it is possible to efficiently store data into an offset storage section since only one point of compensation data (DC offset) is required to represent a linear region.

The invention provides the polar modulation circuit further comprising a transient characteristic compensation circuit which compensates for a transient response caused by amplitude modulation by the amplifying section by adjusting the coefficient stored in the coefficient storage section. The transient characteristic compensation circuit includes a multiplier circuit which multiplies the coefficient stored in the coefficient storage section by a predetermined value. The transient characteristic compensation circuit further includes a multiplier circuit which multiplies an input signal to the amplitude modulation section by a predetermined value.

With these configurations, it is possible to enhance the distortion compensation accuracy of an amplifying section in the amplitude modulation state.

The invention provides the polar modulation circuit wherein the transient characteristic compensation circuit selects the predetermined value used for multiplication in the multiplier circuit in accordance with a transmit output power of the amplifying section. The transient characteristic compensation circuit selects the predetermined value used for multiplication in the multiplier circuit in accordance with a root-mean-square value of the amplitude modulation signal.

With these configurations, it is possible to maintain the distortion compensation accuracy of an amplifying section even in case a transmit power is changed.

The invention provides the polar modulation circuit wherein the transient characteristic compensation circuit includes a multiplying digital/analog conversion circuit which multiplies an input signal to the amplitude modulation section by a predetermined value.

With this configuration, it is possible to reduce the circuit scale.

The invention provides the polar modulation circuit wherein the transient characteristic compensation circuit select a reference potential of the multiplying digital/analog conversion circuit in accordance with a transmit output power of the amplifying section.

With this configuration, it is possible to maintain the distortion compensation accuracy of an amplifying section even in case a transmit power is changed.

The invention provides the polar modulation circuit further comprising an environment state detection section which detects an environment state and an environment state compensation circuit which adjusts the DC offset or the coefficient in accordance with a detection signal output from the environment state detection section. The environment state compensation circuit includes a data table which retains the DC offset stored in the offset storage section, the coefficient stored in the coefficient storage section, the coefficient used for multiplication in the transient characteristic compensation circuit, or a reference potential to be supplied to the multiplying digital/analog conversion circuit for each environment state.

With these configurations, it is possible to maintain the distortion compensation accuracy of an amplifying section even in case an environment state such as an environmental temperature is changed.

The invention provides the polar modulation circuit wherein the environment state compensation circuit selects the DC offset, the coefficient, the multiplication coefficient or the reference potential retained in the data table in accordance with a detection signal output from the environment state detection section.

With this configuration, it is possible to maintain the distortion compensation accuracy of an amplifying section even in case an environment state is changed.

The invention provides the polar modulation circuit wherein the environment state detection section detects the consumption current by the amplifying section.

With this configuration, it is possible to readily detect a change in the consumption current by an amplifying section.

The invention provides the polar modulation circuit wherein the environment state detection section detects an environmental temperature.

With this configuration, it is possible to readily detect a change in the environmental temperature.

The invention provides an integrated circuit comprising the polar modulation circuit according to the invention.

With this configuration, it is possible to provide a radio section transmission system at low cost.

The invention provides a radio apparatus comprising the polar modulation circuit according to the invention or the integrated circuit according to the invention.

With this configuration, it is possible to provide a high-efficiency transmitter.

ADVANTAGE OF THE INVENTION

According to the invention, it is possible to compensate for distortion of an output signal from an amplifying section by way of a one-time process of adding or subtracting a DC offset stored in an offset storage section and a one-time process of multiplying or dividing by a coefficient stored in a coefficient storage section. This suppresses an increase in the scale of a polar modulation circuit including a circuit related to distortion compensation while assuring the compensation accuracy.

BRIEF DESCRIPTION OF THE DRAWINGS

FIG. 5B It shows an example of skeleton framework of a polar modulation circuit according to the second embodiment of the invention.

FIG. 17 It shows the sampling interval conversion operation in an address calculation circuit in a related art distortion compensation circuit of the pre-distortion system in the quadrature modulation system.

FIG. 18 It shows an example of a correction signal stored in a memory in a related art distortion compensation circuit of the pre-distortion system in the quadrature modulation system.

Figure 1A:
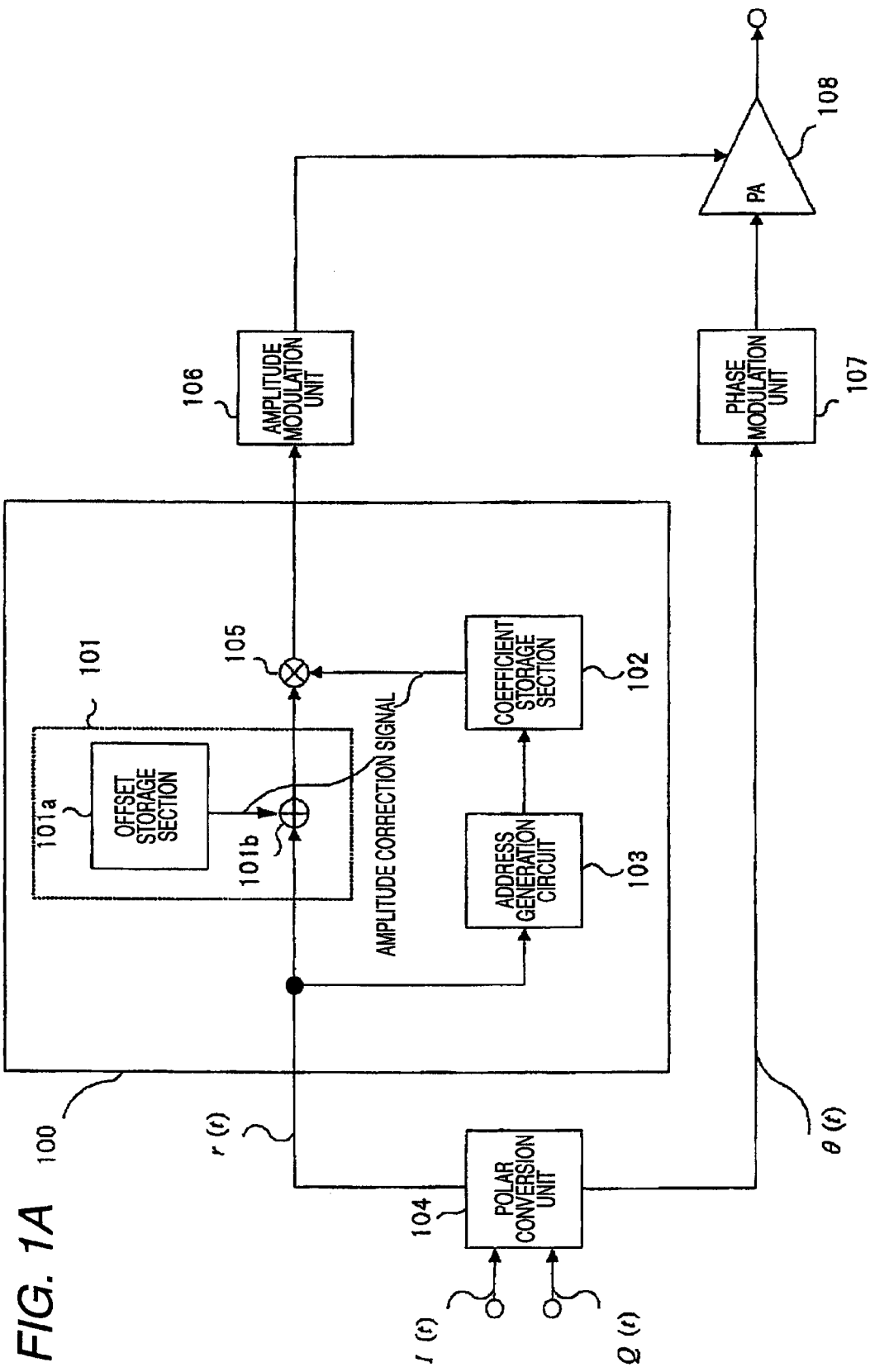
FIG. 1A It shows a skeleton framework of a polar modulation circuit according to the first embodiment of the invention (A).

DESCRIPTION OF REFERENCE NUMERALS AND SIGNS 100, 500, 600, 800 AM-AM characteristic compensation circuit
101, 601, 801 offset compensation circuit
101a, 601a, 801a offset storage section
101b adder circuit
102, 602 coefficient storage section
103 address generation circuit
104, 1101 polar conversion unit
105, 2002, 2102 multiplier circuit
106, 1104 amplitude modulation unit
107, 1107 phase modulation unit
108, 1100 power amplifier
501, 2001, 2101 transient characteristic compensation circuit
502, 1102, 1402, 1802 memory
1103 amplitude information correction unit
1105 amplitude controller
1106 phase information correction unit
1108 phase modulation signal generator
1400 distortion compensation circuit
1401 amplitude component extraction circuit
1403 correction unit
1404 address calculation circuit
1801 approximation function adder section
2000, 2100, 2200 AM-AM characteristic compensation circuit
2201 MDAC
2300 environment state detection section
2301 environment state compensation circuit

BEST MODE FOR CARRYING OUT THE INVENTION

First Embodiment

A first embodiment of the invention describes a polar modulation circuit including a distortion compensation circuit of the pre-distortion system capable of reducing the capacity of data stored in memory and suppressing an increase in the circuit scale related to distortion compensation in the polar modulation system while assuring the compensation accuracy, which advantages have been unavailable so far even through any combination of related art practices.

FIG. 1A shows a skeleton framework of a polar modulation circuit according to the first embodiment of the invention. As shown in FIG. 1A, a polar modulation circuit according to the first embodiment of the invention comprises polar conversion unit 104, an AM-AM characteristic compensation circuit 100, amplitude modulation unit 106, phase modulation unit 107, and a power amplifier 108.

The AM-AM characteristic compensation circuit 100 includes an offset compensation circuit 101, a coefficient storage section 102, an address generation circuit 103, and a multiplier circuit 105 and performs predetermined distortion compensation processing on amplitude information r(t). The distortion compensation processing will be detailed later.

The polar conversion unit 104 separates an IQ signal input from a baseband signal generator section (not shown) into an amplitude signal r(t) and a phase signal θ(t) of a constant amplitude. Normalization may be done so that r(t) will have a maximum value of 1.

The amplitude modulation unit 106 drives the control voltage for the power amplifier 108 at high speed based on an output signal from the AM-AM characteristic compensation circuit 100. The phase modulation unit 107 performs phase modulation based on an output signal from the polar conversion unit 104. The power amplifier 108 is driven at high speed with the output of the phase modulation unit 107 used as an input high frequency signal and the output of the amplitude modulation unit 106 used as a control voltage.

The offset compensation circuit 101 includes an offset storage section 101a and an adder circuit 101b and applies a predetermined DC offset voltage stored in the offset storage section 101a as a first amplitude correction signal to a baseband amplitude signal r(t) output from the polar conversion unit 104.

The coefficient storage section 102 stores a coefficient representing the positive characteristic of the output signal amplitude characteristic (AM-AM) relative to the input control signal of the power amplifier 108 for a predetermined input high frequency signal amplitude. The coefficient storage section 102 then outputs a second amplitude correction signal having the inverse characteristic of the power amplifier 108 in accordance with an output signal from the address generation circuit 103. The inverse characteristic refers to a multiple of the inverse function of a positive characteristic by a predetermined constant. The coefficient will be detailed later.

The address generation circuit 103 selects an address to be output using a preset threshold (Th1) as a reference for an amplitude signal r(t) output from the polar conversion unit 104. The method for selecting an address will be detailed later.

The multiplier circuit 105 corrects an output signal from the offset compensation circuit 101 based on the second amplitude correction signal output from the coefficient storage section 102. The amplitude modulation unit 106 drives the control voltage for the power amplifier 108 at high speed based on an output signal from the multiplier circuit 105.

The phase modulation unit 107 performs phase modulation based on a baseband phase signal output from the polar conversion unit 104. In case, for example, the phase modulation unit further includes an orthogonal coordinate conversion unit for converting phase information θ(t) to orthogonal coordinates of a constant amplitude on top of phase modulation unit called the fractional N/PLL system, the phase modulation unit may include an orthogonal modulation unit or a phase modulation unit called the offset PLL system.

In case the polar modulation circuit according to the first embodiment of the invention is used in a transmitter, a digital/analog converter circuit (hereinafter referred to as a D/A converter) (not shown) is arranged in each of the pre-stage of the amplitude modulation unit 106 and the pre-stage of the phase modulation unit 107.

(Distortion Compensation by the AM-AM Characteristic Compensation Circuit 100)

Figure 2:
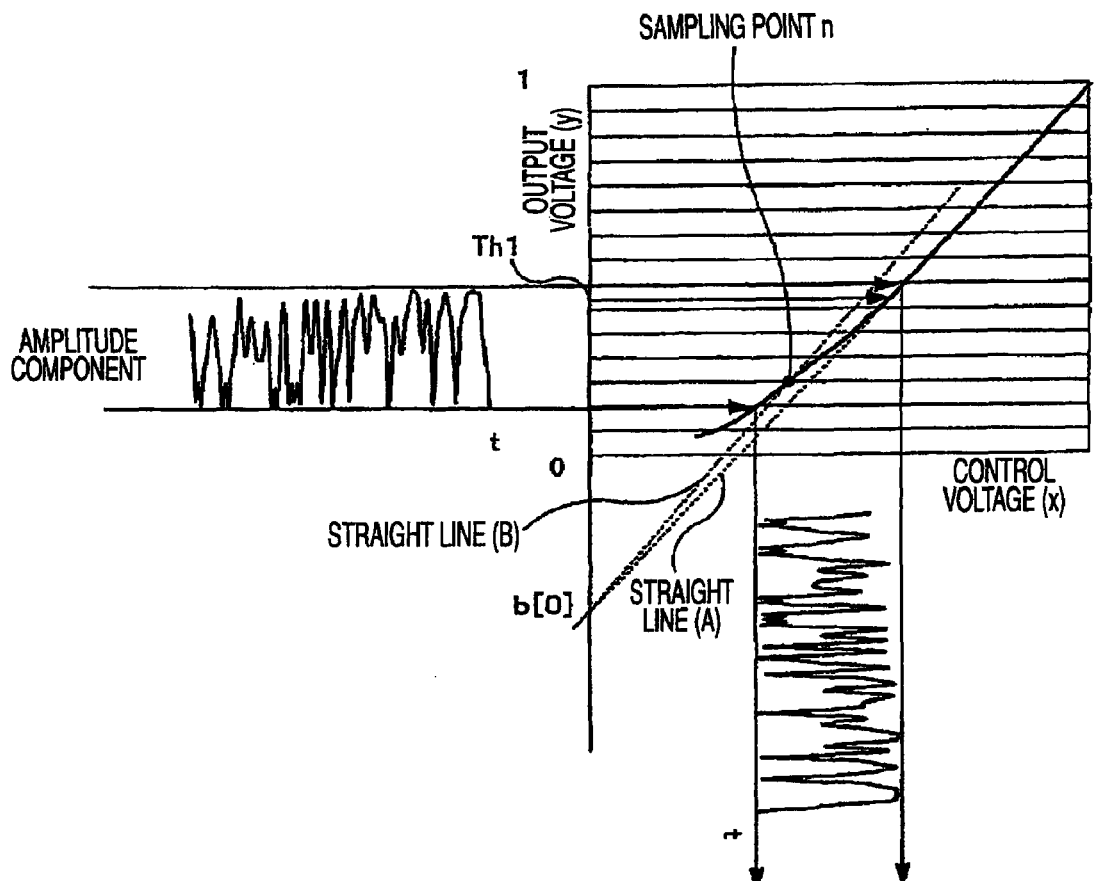
FIG. 2 It shows an example of the output signal amplitude characteristic relative to the input control signal of a power amplifier.

Next, a distortion compensation processing by the AM-AM characteristic compensation circuit 100 will be detailed. Assume that the positive characteristic of the output signal amplitude characteristic (AM-AM) relative to the input control signal of the power amplifier 108 is represented by the graph in FIG. 2. In FIG. 2, the horizontal axis represents a control voltage (x) applied to the power amplifier 108 and the vertical axis an output voltage (y) from the power amplifier 108. The curve shown by the solid line in the figure represents the output voltage characteristic of a basic frequency in the steady state obtained in case a predetermined control voltage is applied. The characteristic of the solid line in FIG. 2 is represented by the expression (1).

[Number 1]

$$y = f(x) \quad (1)$$

Figure 13:
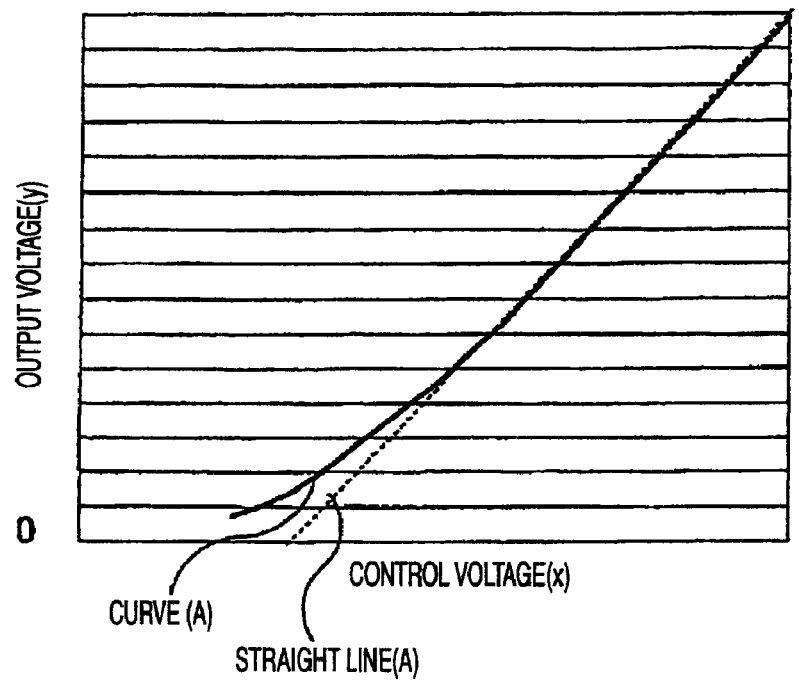
FIG. 13 It shows an example of the output signal amplitude characteristic relative to the input control signal of a power amplifier in related art polar modulation apparatus to which distortion compensation of the pre-distortion system is applied.
Figure 14:
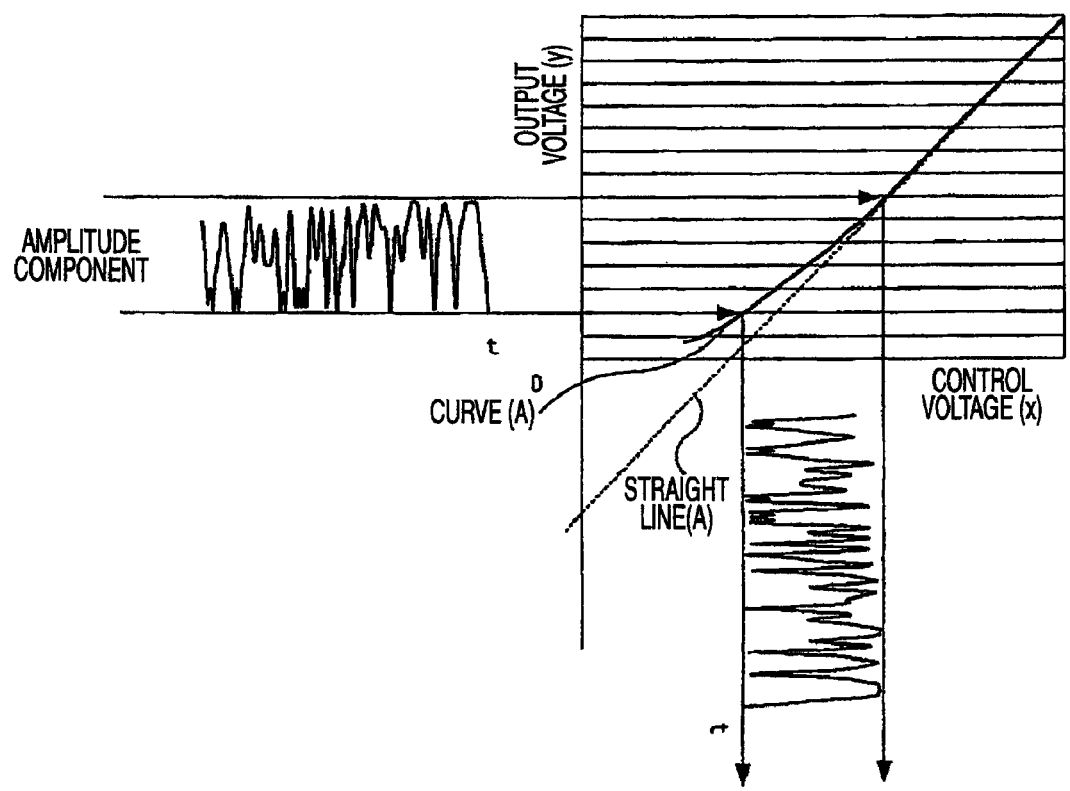
FIG. 14 It shows the relationship between a control voltage applied to a power amplifier and an output amplitude signal in related art polar modulation apparatus to which distortion compensation of the pre-distortion system is applied.
Figure 15:
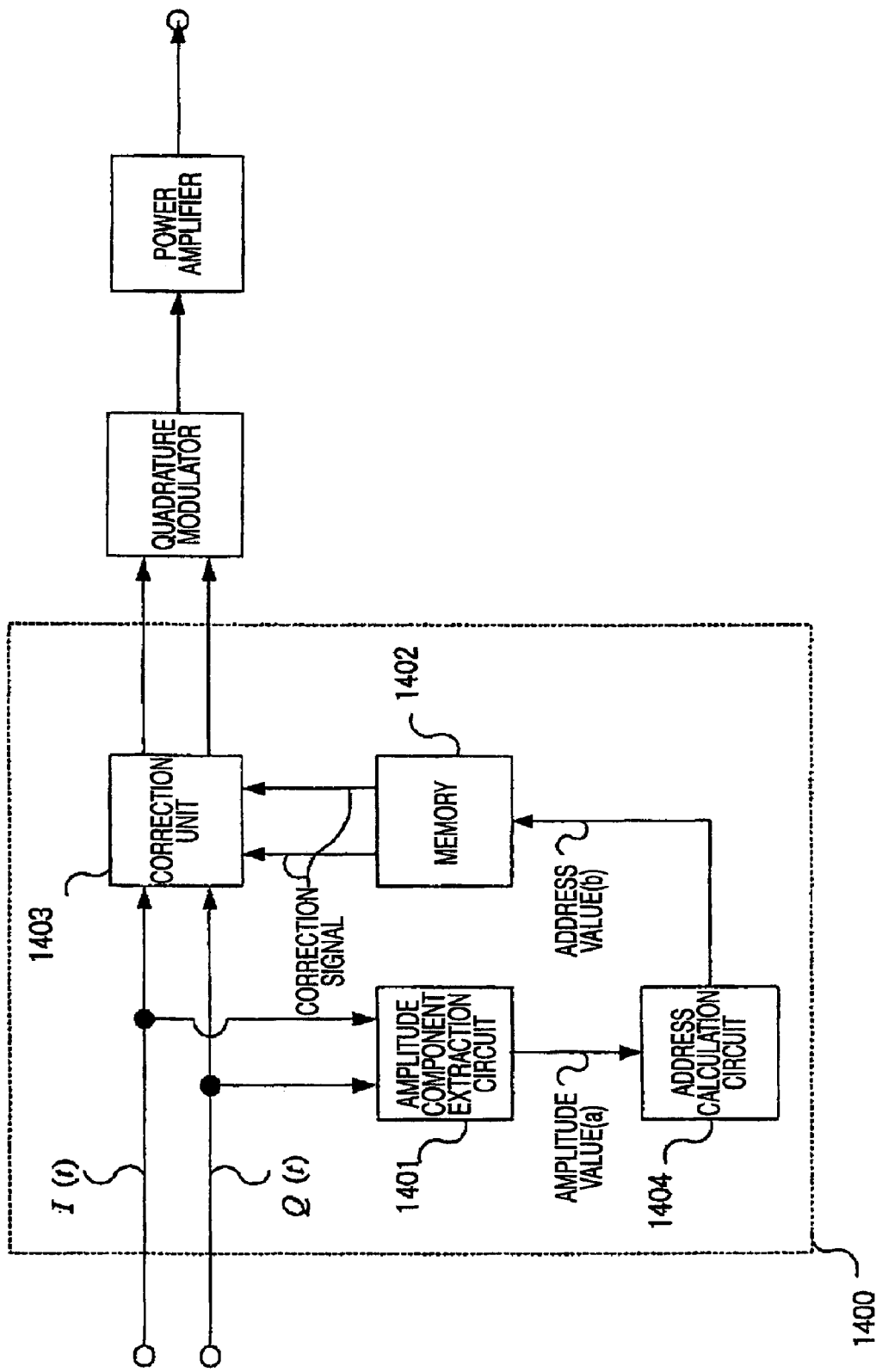
FIG. 15 It is a block diagram showing a related art distortion compensation circuit of the pre-distortion system in the quadrature modulation system.
Figure 16:
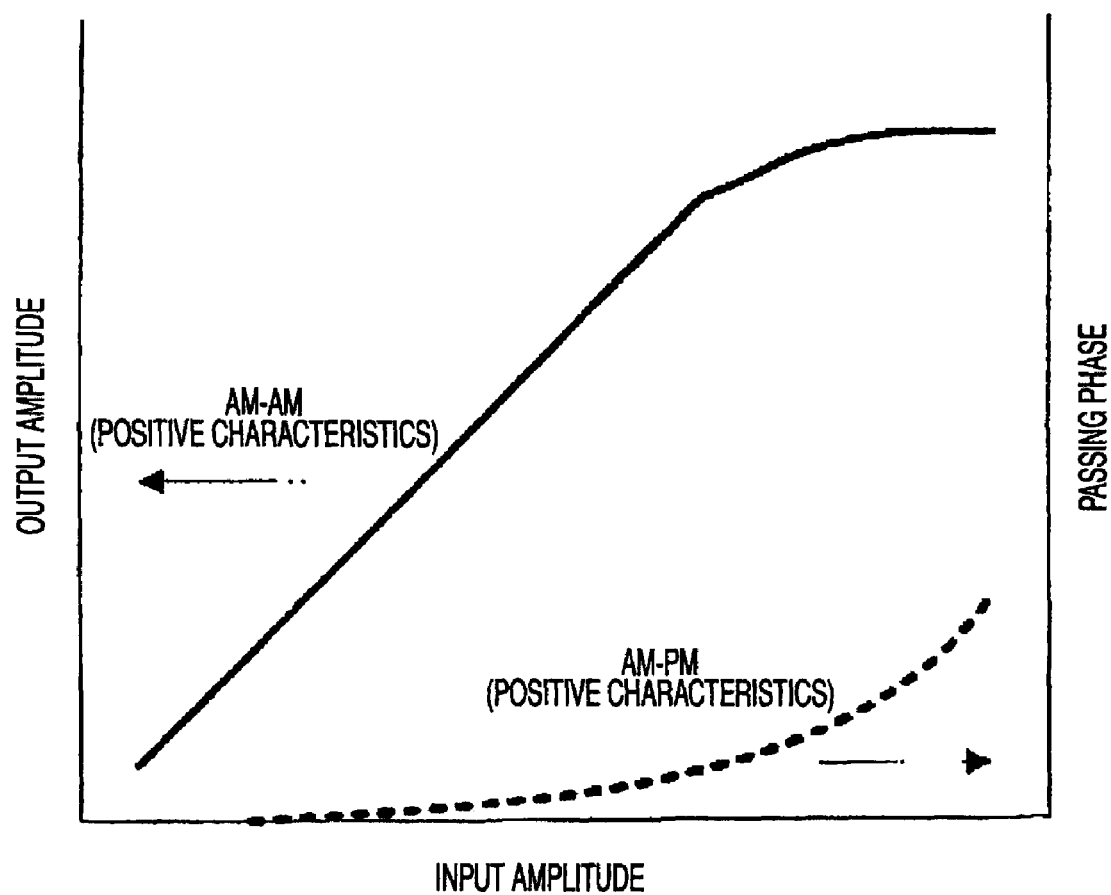
FIG. 16 It shows an example of the output signal amplitude characteristic and passing phase characteristic for the input high frequency signal of the power amplifier in a related art distortion compensation circuit of the pre-distortion system in the quadrature modulation system.
Figure 19:
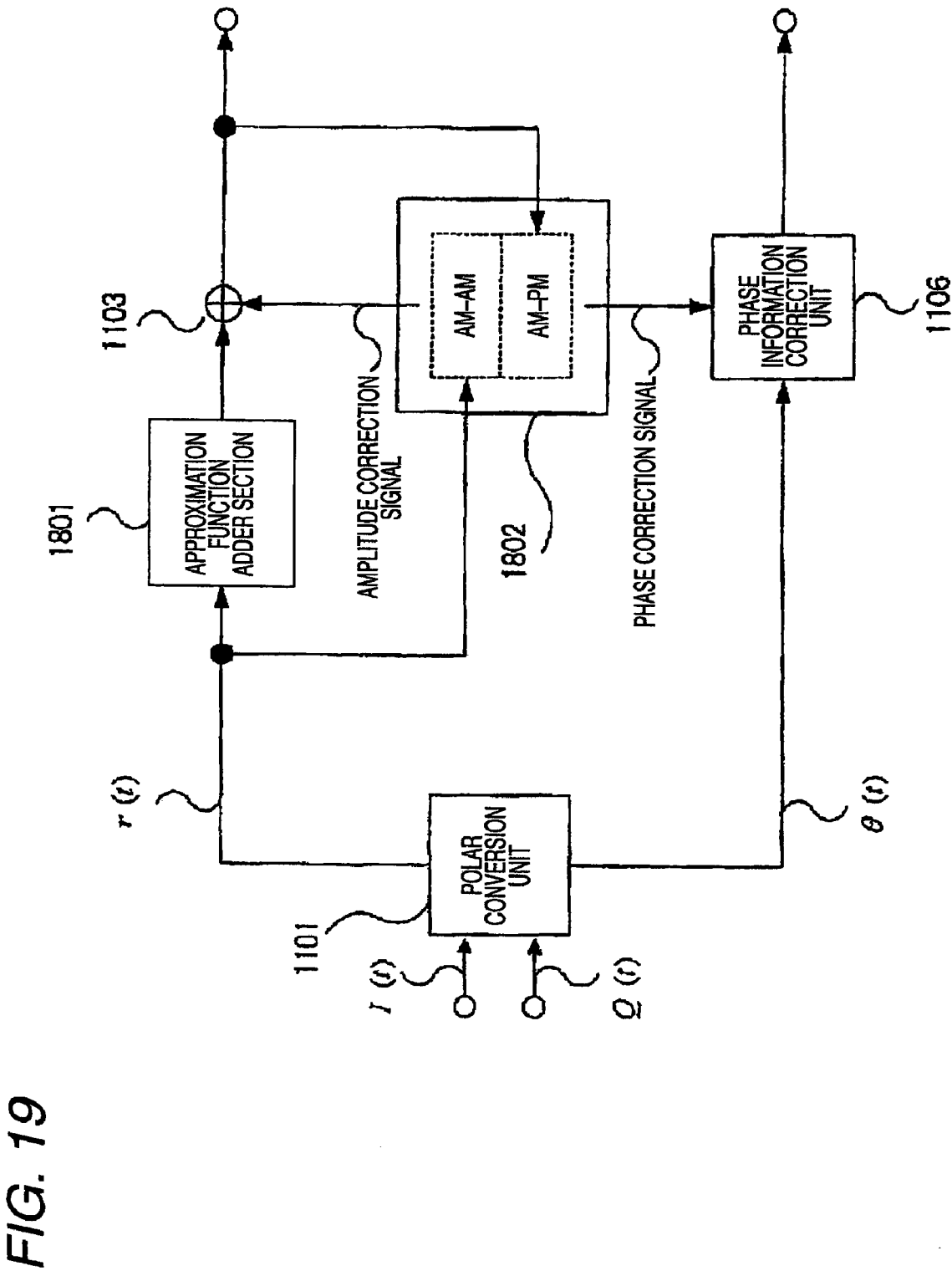
FIG. 19 It is a block diagram showing a related art distortion compensation circuit of the pre-distortion system in the quadrature modulation system.
Figure 20:
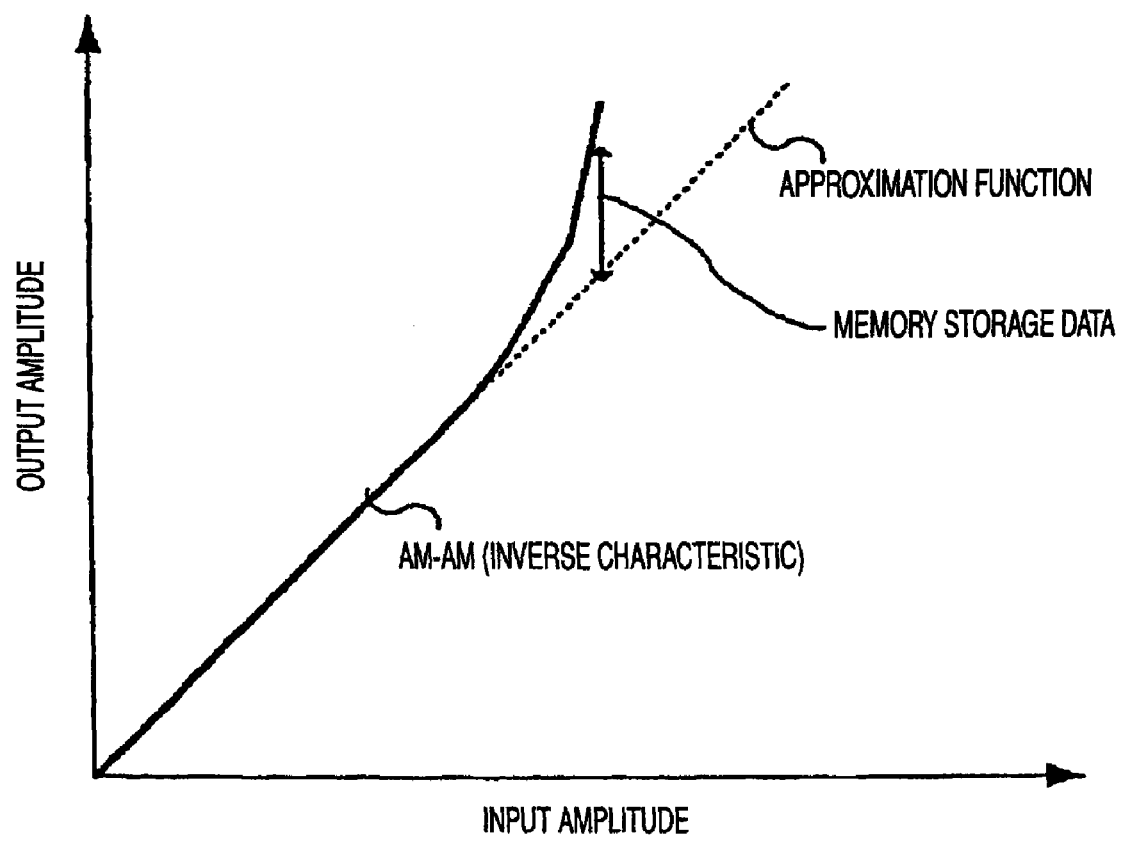
FIG. 20 It shows the roles of an approximation function adder section and a memory in a related art distortion compensation circuit of the pre-distortion system in the quadrature modulation system.

This characteristic is the same as that of the solid line shown in FIGS. 13 and 14. A control voltage to be applied to the power amplifier 108 is obtained when an amplitude signal is represented. That is, the relationship between the control voltage to be applied to a power amplifier and the output amplitude signal is the same as that shown in FIG. 14. A straight line (A) shown by a dotted line in the figure indicates the characteristic of an extended linear region of the curve and can be represented by the expression (2). A straight line (B) shown by a dotted line in the figure is a straight line connecting an intercept b[0] of the straight line (A) on the output voltage (y) axis and a point obtained by sampling the AM-AM positive characteristic at predetermined intervals (sampling point n where n is 0 to N−1 in ascending order of control voltage where N is the number of data points stored into memory) and is represented by the expression (3). In other words, the straight lines (A) and (B) indicate straight lines that have the intercept b[0] on the output voltage (y) axis in common and separate inclinations (n≦N−2).

[Number 2]

$$y = a[0] \times x + b[0] \quad (2)$$

$$y = a[(N-1)-n] \times x + b[0] \quad (3)$$

In the first embodiment of the invention, normalization is made in the polar conversion unit 104 so that the maximum value of the amplitude signal r(t) with the maximum output setting will be 1 in the setting of the output level of the power amplifier 108, and the value of the amplitude signal r(t) is multiplied by a constant smaller than 1 according to the output level when the output level is reduced. Thus, the output voltage axis shown in FIG. 2 is also normalized so that the maximum value will be 1. A symbol Th1 in FIG. 2 is a threshold set to an amplitude signal in the address generation circuit 103 and indicates the boundary line between the linear region and the nonlinear region of the AM-AM characteristic on the output voltage axis.

Figure 11:
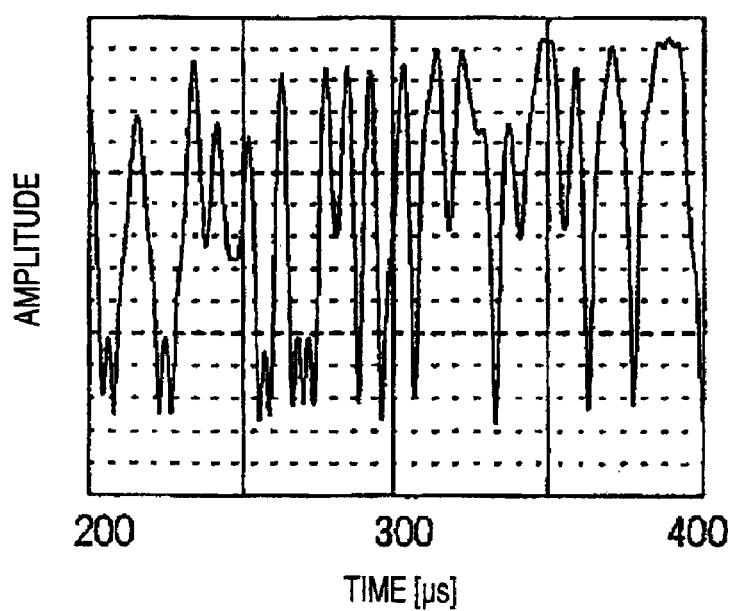
FIG. 11 It shows an amplitude component of a related art 8-PSK modulation signal.
Figure 12:
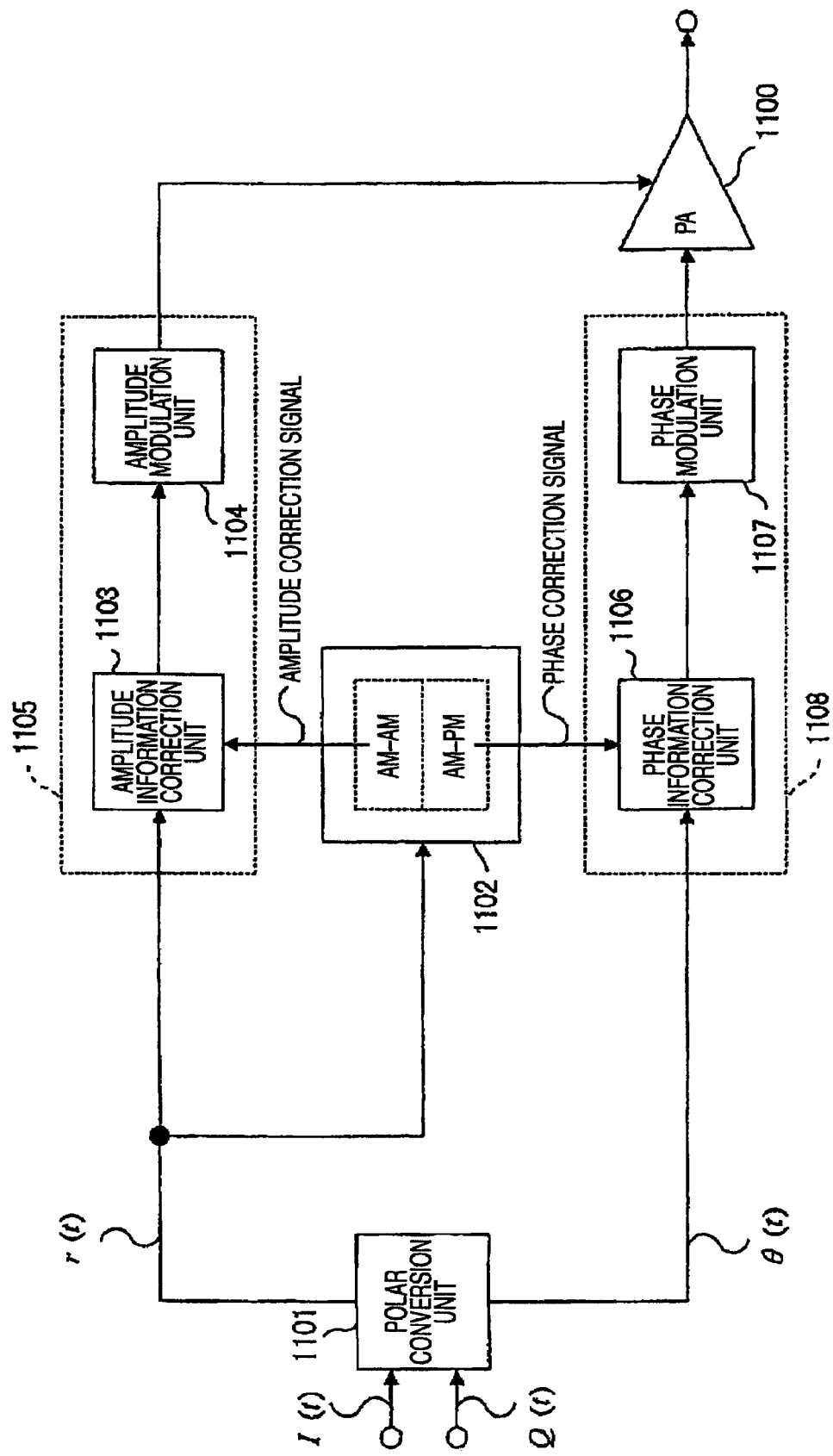
FIG. 12 It is a block diagram showing related art polar modulation apparatus to which distortion compensation of the pre-distortion system is applied.

First, in FIG. 2, operation to obtain the inverse characteristic of the output signal amplitude characteristic (AM-AM) relative to the input control signal, that is, the data for compensating the AM-AM characteristic is described taking as an example the amplitude signal shown in FIG. 11.

In the example of FIG. 2, although there is a region where the amplitude component is off the straight line (A) represented by the expression (2), assume a case where an amplitude component is in a region (r(t)≧Th1) where it can be represented by the expression (2). The inverse function of the expression (2) can be represented by the expression (4).

[Number 3]

$$x = \frac{1}{a[0]} \times \{y + (-b[0])\} \quad (4)$$

Considering the correspondence to FIG. 1A, the amplitude signal r(t) output from the polar conversion unit 104 is y. By adding the data (−b[0]) stored in the offset storage section 101a to y in the offset compensation circuit 101 and multiplying in the multiplier circuit 105 the result by the second amplitude correction signal (1/a[0]) output from the coefficient storage section 102, it is possible to obtain x as a signal output to the amplitude modulation unit 106.

That is, the operations of the offset compensation circuit 101 for adding an offset voltage to an amplitude signal, the coefficient storage section 102 which stores an inclination, and the multiplier circuit 105 for multiplying an output signal from the offset compensation circuit 101 by a predetermined value perform AM-AM characteristic compensation on the region that can be represented by the straight line (A) of the AM-AM characteristic shown by the solid line in FIG. 2.

Next, assume a case where an amplitude component is in a region where it cannot be represented by the expression (2), that is, a nonlinear region (r(t)<Th1) is included. In this case, the inverse function of the expression (3) can be represented by the expression (5).

[Number 4]

$$x = \frac{1}{a[(N-1)-n]} \times \{y + (-b[0])\} \tag{5}$$

(Storing the Inclination of a Straight Line into the Coefficient Storage Section 102)

First, concerning a method for compensating for a nonlinear region, the difference between the AM-AM characteristic compensation circuit 100 in the first embodiment of the invention and the related art distortion compensation circuit of the pre-distortion system described in Patent Reference 3 will be explained. The distortion compensation circuit of the pre-distortion system described in Patent Reference 3 stores the difference value between a straight line representing a linear region and a nonlinear region into the memory 1802, while the AM-AM characteristic compensation circuit 100 in the first embodiment of the invention represents a nonlinear region by a predetermined straight line separate from a linear region and stores the inclination of the predetermined straight line into the coefficient storage section 102.

Assume that the storage data for a sampling point n (hereinafter referred to as the address number n) is D[n] (where n=N−1 is used to represent a linear region and n=0 to N−2 is assumed). Sampling interval for n=0 to N−2 is constant.

The distortion compensation circuit described in Patent Reference 3 stores the difference value between a straight line representing a linear region and a nonlinear region into memory. It is thus possible to represent the storage data D[n] for the address number n by the expression (6).

In the meantime, the AM-AM characteristic compensation circuit 100 in the first embodiment of the invention represents a nonlinear region by a predetermined straight line separate from a linear region and stores the inclination of the predetermined straight line into the coefficient storage section 102. It is thus possible to represent the storage data D[n] for the address number n by the expression (7).

[Number 5]

$$D[n] = f(x_n) - (a[0] \times x_n + b[0]) \tag{6}$$

$$D[n] = a[(N-1)-n] \tag{7}$$

(Address Selection Method in the Address Generation Circuit 103)

Figure 3:
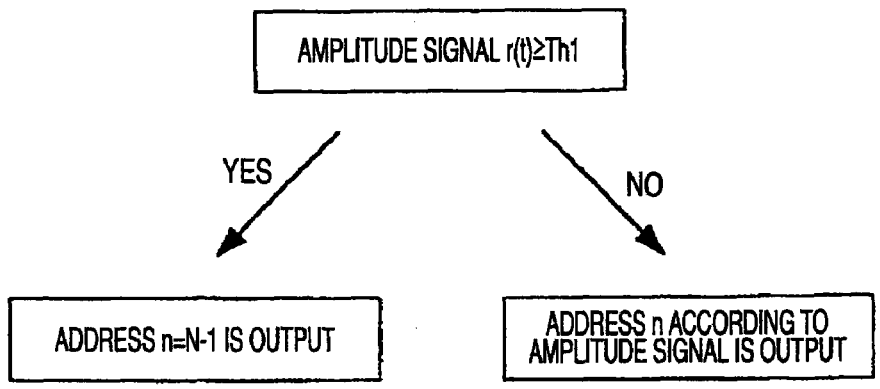
FIG. 3 It shows a processing flow in an address generation circuit.

An address selection method in the address generation circuit 103 will be described. FIG. 3 shows a flow of processing in the address generation circuit 103. In case the amplitude signal r(t) output from the polar conversion unit 104 is equal to or larger than the threshold (Th1), an address n=N−1 is output.

In case the amplitude signal r(t) is below the threshold (Th1), the amplitude signal r(t) is assigned to address numbers partitioned by a constant sampling interval to output the address n (n=0 to N−2). In other words, an address n corresponding to the amplitude signal is output.

Assuming that an amplitude signal corresponding to an address number (n−2) is r(n−2) and an amplitude signal corresponding to an address number (n−1) is r(n−1), only one point of compensation data to represent a linear region is required under the conditions of the expression (8). This provides the best efficiency of data storage into the coefficient storage section 102.

[Number 6]

$$r(n-2) < Th1 \leq r(n-1) \tag{8}$$

As described so far, the AM-AM characteristic compensation circuit 100 in the first embodiment of the invention has an advantage like in Patent Reference 2 or Patent Reference 3 that reduces the compensation data volume compared with a case where a constant sampling interval is used to acquire compensation data in both the linear and nonlinear regions. The AM-AM characteristic compensation circuit 100 in the first embodiment of the invention also has another advantage that further reduces the circuit scale because only one point of compensation data is stored into the coefficient storage section 102 in order to represent a linear region.

In addition, the AM-AM characteristic compensation circuit 100 in the first embodiment of the invention has one-time addition process and one-time multiplication process by adding the offset voltage with the offset compensation circuit 101 and storing the compensation data into the coefficient storage section 102 with the expression (7). Thus, the AM-AM characteristic compensation circuit 100 in the first embodiment of the invention also has other advantage that reduces counts of the calculation processing compared with the case (two-time addition process and one-time multiplication process) that applies the compensation circuit to the polar system shown in Patent Reference 3.

In the distortion compensation processing that requires real time processing of transmit data, an increase in the arithmetic operation, that is, an increase in the arithmetic time makes it difficult to apply the distortion compensation processing to cell phone services or a wireless LAN (Local Area Network) system where fast data transmission is in mainstream. Thus, the smallest volume of arithmetic operation possible is desirable and thus the AM-AM characteristic compensation circuit 100 of the invention is advantageous.

(Reason of the Form of Data Stored into the Coefficient Storage Section 102)

The reason why, in the first embodiment of the invention, the form of data to be stored into the coefficient storage section 102 is not represented by the difference of data between the nonlinear region and the straight line as in Patent Reference 3 but by the inclination of a straight line representing all necessary regions is described below.

Figure 4:
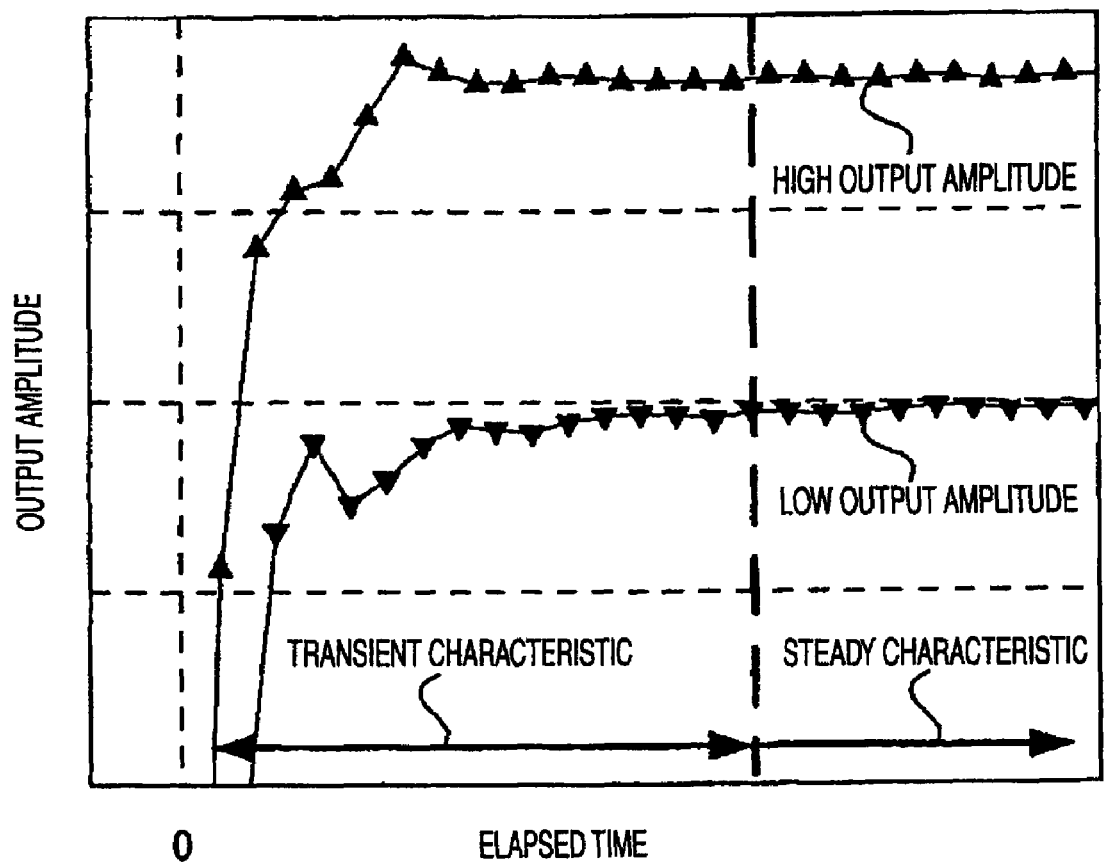
FIG. 4 It shows a step response characteristic relative to the control voltage of an output signal amplitude in a state where an input high frequency signal amplitude at a level a power amplifier performs saturation operation is given.

In case the control voltage for a power amplifier is driven at high speed and is amplitude modulated in the power amplifier like in the polar modulation system (hereinafter referred to as amplitude modulation), a transient response characteristic from when the control voltage is applied to when a desired output level is reached makes it difficult to obtain a desired output level. FIG. 4 shows the step response characteristic of an output signal amplitude for the control voltage in a state where an input high frequency signal amplitude at a level a power amplifier performs saturation operation is given. In FIG. 4, the horizontal axis represents a time that has elapsed since the control signal is input to an power amplifier and the vertical axis the output signal amplitude of the power amplifier.

As shown in FIG. 4, when the control voltage supplied to a power amplifier is changed from 0 volts to a predetermined level, a transient response characteristic is indicated before a stead state that the output amplitude is stabilized in a state where an input high frequency signal at a level a power amplifier performs saturation operation is given. In the example of FIG. 4, step response characteristics to two types of control voltage value (steady state) are indicated. The input high frequency signal amplitude is constant while the step response characteristic is being acquired. To compensate for the transient response characteristic, the polar modulation apparatus shown in FIG. 5A is advantageous.

(Adjusting the Inclination to Compensate for Transient Response Characteristic)

Figure 5A:
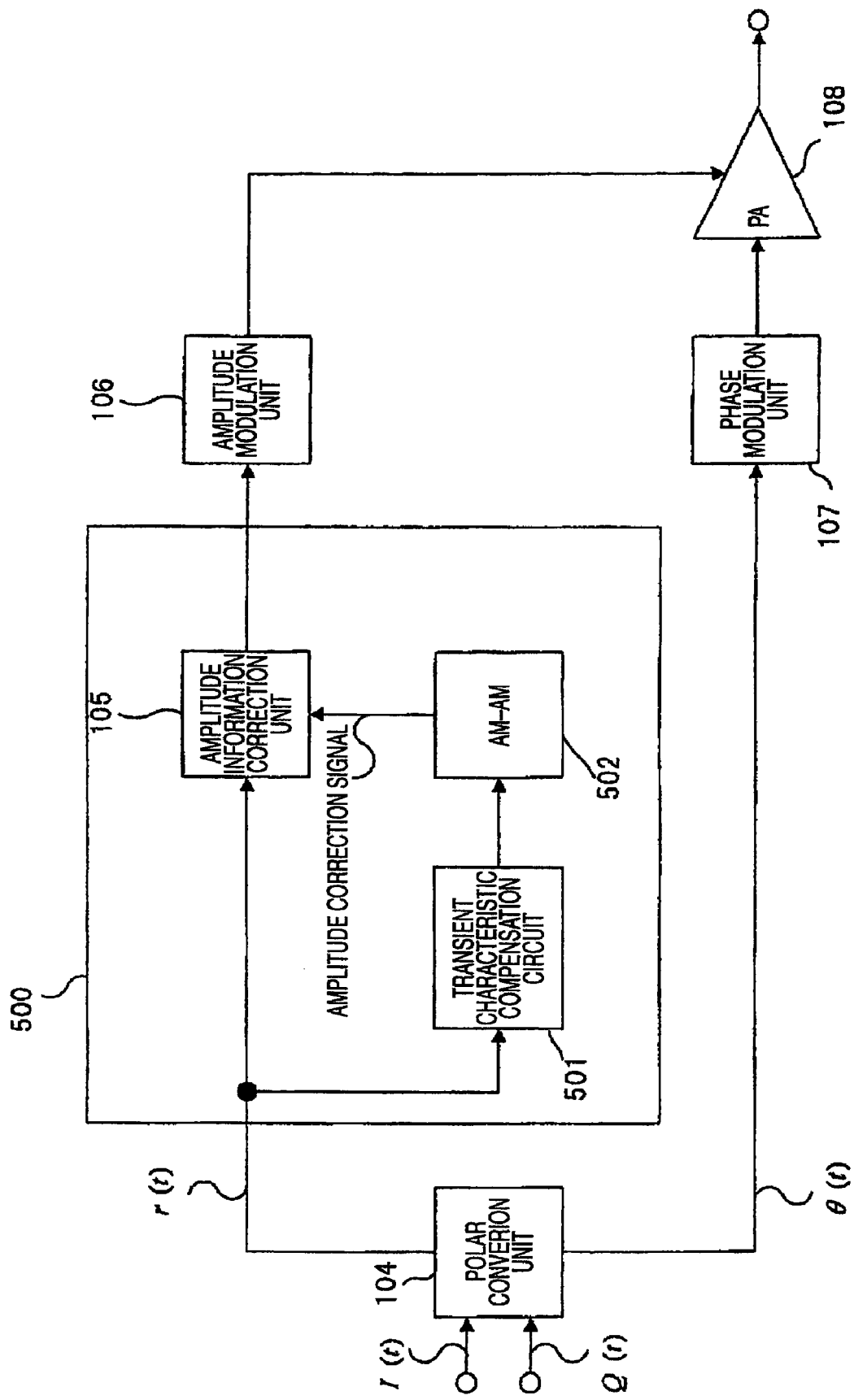
FIG. 5A It shows another example of skeleton framework of a polar modulation circuit according to the first embodiment of the invention.

FIG. 5A shows an example of skeleton framework of a polar modulation circuit. As shown in FIG. 5A, the polar modulation circuit comprises polar modulation unit 104, an AM-AM characteristic compensation circuit 500, amplitude modulation unit 106, phase modulation unit 107, and a power amplifier 108.

The AM-AM characteristic compensation circuit 500 includes a transient characteristic compensation circuit 501, a memory 502, and amplitude information correction unit 105 and performs predetermined distortion compensation processing on the amplitude information r(t). The distortion compensation processing will be detailed later. A same sign as in FIG. 1 is given to a portion in FIG. 5A that is common to FIG. 1 illustrating polar modulation apparatus to which distortion compensation of the pre-distortion system described in Patent Reference 1 is applied.

The memory 502 stores the positive characteristic of the output signal amplitude characteristic (AM-AM: Amplitude Modulation to Amplitude Modulation conversion) relative to the input control signal of the power amplifier 108 for a predetermined input high frequency signal amplitude. An amplitude correction signal and a phase correction signal having the inverse characteristic of the power amplifier 108 are output in accordance with an input amplitude signal r(t). The inverse characteristic refers to a multiple of the inverse function of a positive characteristic by a predetermined constant. The data stored into the memory 502 is data of a steady characteristic as shown in FIGS. 2, 13 and 14. Thus in a region where the step response characteristic of a power amplifier indicates a transient response shown in FIG. 4, it is difficult to set a precise output level.

In reality, a step response is acquired beforehand. The set level is exceeded in the transient response period for a high output amplitude shown in FIG. 4 so that a predetermined level can be output by accordingly reducing the control voltage. For a low output amplitude shown in FIG. 4, the set level is not exceeded in the transient response period so that a predetermined level can be output by accordingly increasing the control voltage.

The inventors discovered in the examination process that, by adjusting the inclination of the AM-AM characteristic to the distortion compensation of a steady characteristic stored in the memory 502 in accordance with the desired output level, it is possible to accurately compensate for a transient response caused by the amplitude modulation by a power amplifier.

The transient characteristic compensation circuit 501 shown in FIG. 5A includes a multiplier circuit that uses a predetermined constant for multiplication in accordance with the output level of a power amplifier in order to adjust the inclination of the AM-AM characteristic. In the polar modulation system, the output level of a power amplifier is controlled via amplitude control of an amplitude modulation signal. Thus, a predetermined multiplier may be used in accordance with for example the root-mean-square value of an amplitude signal instead of the output level of a power amplifier.

As described in Patent Reference 3, by representing the form of data stored into the coefficient storage section 102 by the inclination of a straight line representing all necessary regions rather than the difference of data between the nonlinear region and the straight line and thus by giving coefficients including a constant used to compensate for a transient response, it is possible to incorporate a feature to compensate for a transient response characteristic.

While in the first embodiment of the invention the coefficient storage section 102 stores a coefficient representing the positive characteristic of the output signal amplitude characteristic (AM-AM) relative to the input control signal of the power amplifier 108 for a predetermined input high frequency signal amplitude and outputs an amplitude correction signal having the inverse characteristic of the power amplifier 108 in accordance with the input amplitude signal r(t), the inverse characteristic may be obtained beforehand and the data stored into the coefficient storage section 102 may be of the inverse characteristic.

While −b[0] is added in the offset compensation circuit 101 in the first embodiment of the invention, +b[0] may be subtracted equivalently.

While $1/a[(N-1)-n]$ is output as a second amplitude correction signal from the coefficient storage section 102 and multiplication is made in the multiplier circuit 105 in the first embodiment of the invention, a configuration is equivalent where a divider circuit is provided instead of the multiplier 105 and $a[(N-1)-n]$ is output as a second amplitude correction signal from the coefficient storage section 102 followed by division in the amplitude information correction unit.

Figure 1B:
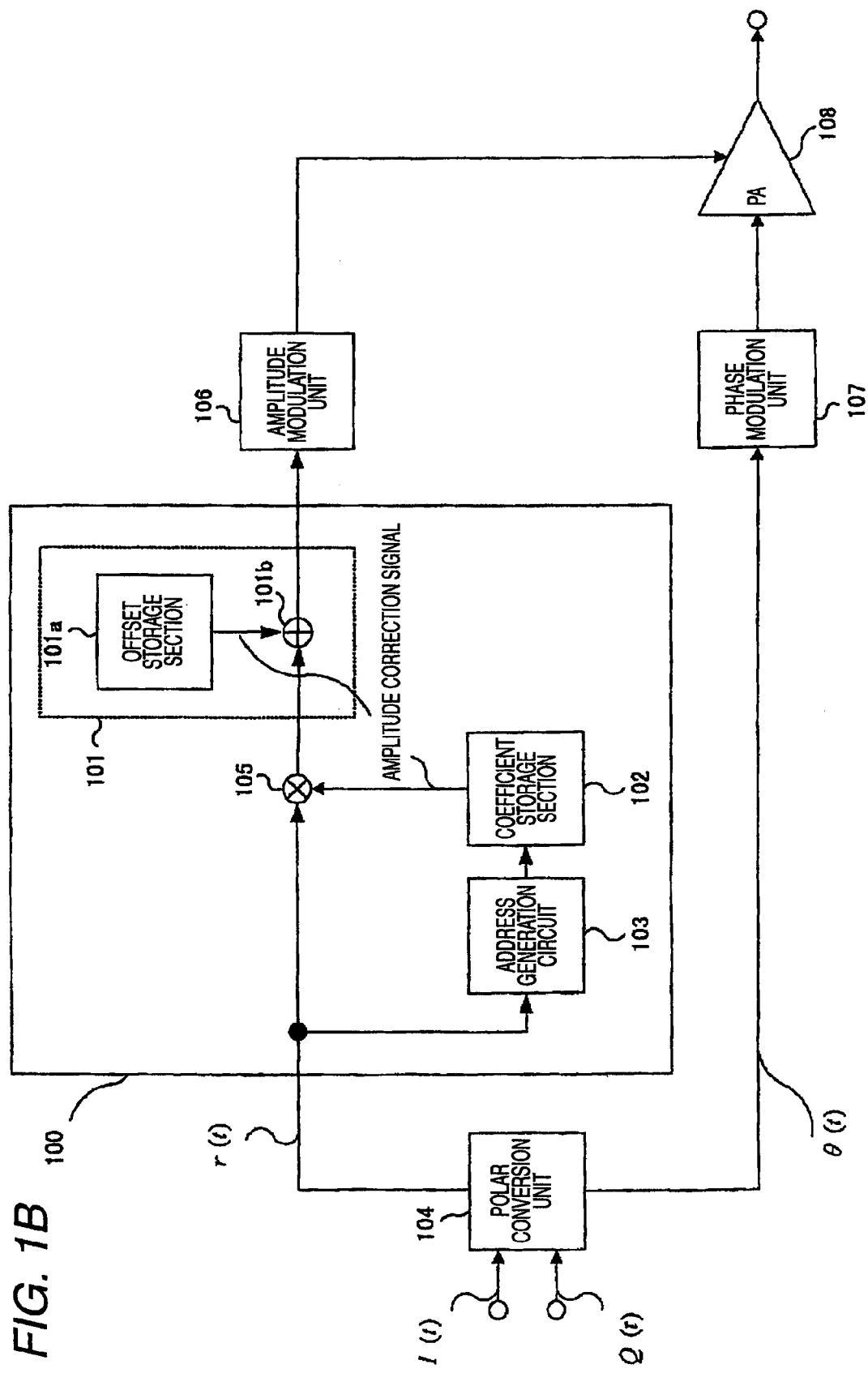
FIG. 1B It shows a skeleton framework of a polar modulation circuit according to the first embodiment of the invention (B).

The same working effect is obtained by a configuration shown in FIG. 1B where the order of the adder circuit 101b and the multiplier circuit 105 shown in FIG. 1A is changed.

The AM-AM characteristic compensation circuit 100 as a distortion compensation circuit disclosed in the first embodiment of the invention or polar modulation circuit may be implemented for example on a silicon semiconductor substrate and may be mounted as an integrated circuit.

Second Embodiment

A second embodiment of the invention describes another example that is capable of compensating for the transient characteristic caused by the amplitude modulation by a power amplifier illustrated in FIG. 5A in accordance with the first embodiment of the invention.

FIG. 5B shows a skeleton framework of a polar modulation circuit according to the second embodiment of the invention. As shown in FIG. 5B, the polar modulation circuit according to the second embodiment of the invention comprises polar conversion unit 104, an AM-AM characteristic compensation circuit 2000, amplitude modulation unit 106, phase modulation unit 107, and a power amplifier 108.

The AM-AM characteristic compensation circuit 2000 includes an offset compensation circuit 101, a coefficient storage section 102, an address generation circuit 103, a transient characteristic compensation circuit 2001, and a multiplier circuit 105 and performs predetermined distortion compensation processing on amplitude information r(t). A same sign as in FIG. 1A of the first embodiment of the invention is given to a portion in FIG. 5B that is common to FIG. 1A, and corresponding description is omitted.

The transient characteristic compensation circuit 2001 includes a multiplier circuit 2002 that multiplies a second amplitude correction signal output from the coefficient storage section 102 by a predetermined coefficient (coeff1) in accordance with the output level of a power amplifier and outputs a third amplitude correction signal that has been multiplied by a predetermined constant to the multiplier circuit 105. The predetermined constant is set based on a philosophy similar to that described in relation to the transient characteristic compensation circuit 501 in the first embodiment of the invention.

With this configuration, the polar modulation circuit according to the second embodiment of the invention is capable of reducing the capacity of data stored in memory and suppressing an increase in the circuit scale related to distortion compensation in the polar modulation system while assuring the compensation accuracy, which advantages have been unavailable so far even through any combination of related art practices.

Figure 5C:
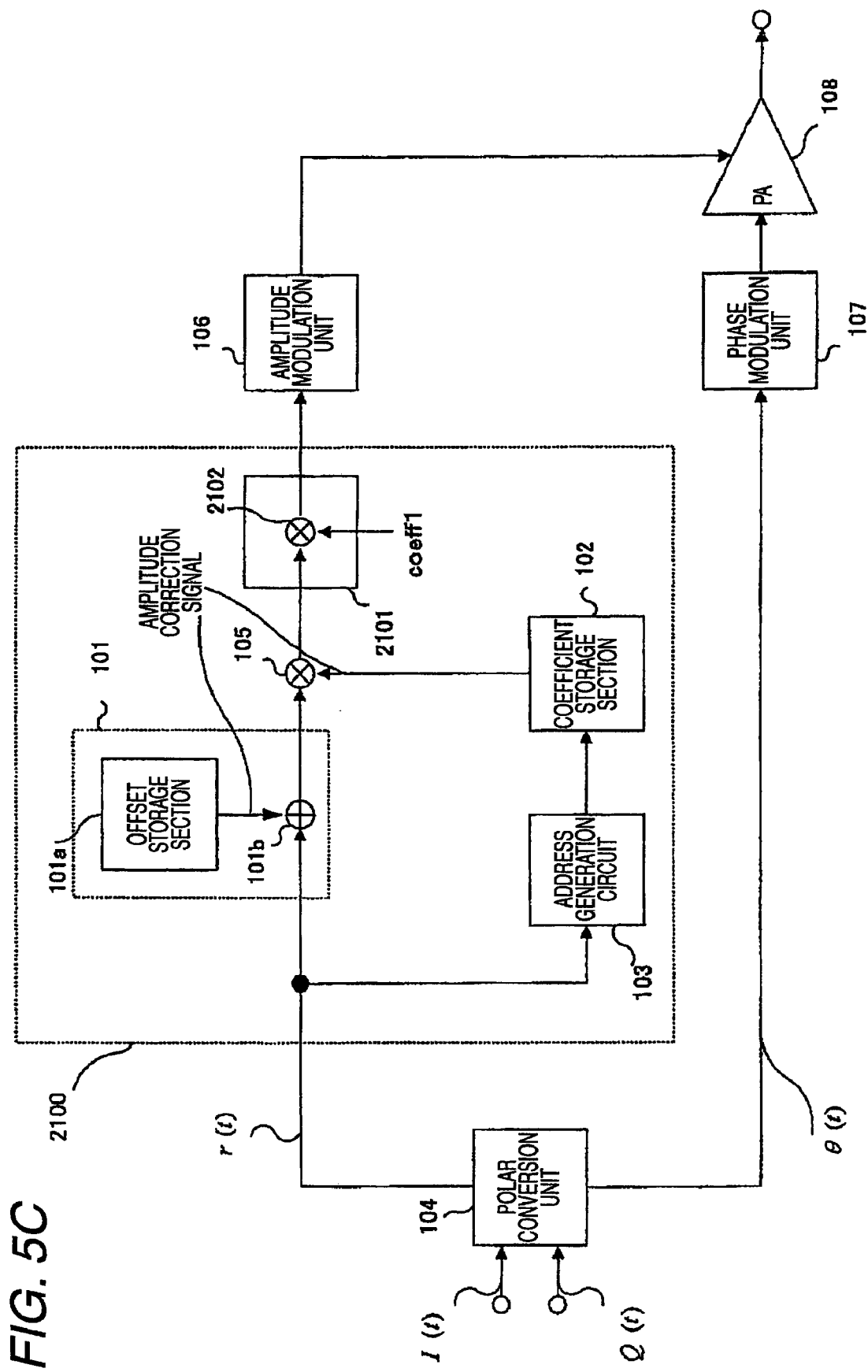
FIG. 5C It shows another example of skeleton framework of a polar modulation circuit according to the second embodiment of the invention.

Another example of a polar modulation circuit indicating the same working effect as the polar modulation circuit shown in FIG. 5B will be described. FIG. 5C shows another example of skeleton framework of the polar modulation circuit according to the second embodiment of the invention. As shown in FIG. 5C, the polar modulation circuit according to the second embodiment of the invention comprises polar conversion unit 104, an AM-AM characteristic compensation circuit 2100, amplitude modulation unit 106, phase modulation unit 107, and a power amplifier 108.

The AM-AM characteristic compensation circuit 2100 includes an offset compensation circuit 101, a coefficient storage section 102, an address generation circuit 103, a transient characteristic compensation circuit 2101, and a multiplier circuit 105 and performs predetermined distortion compensation processing on amplitude information r(t). A same sign as in FIG. 5B of the first embodiment of the invention is given to a portion in FIG. 5C that is common to FIG. 5B and corresponding description is omitted.

The transient characteristic compensation circuit 2101 includes a multiplier circuit 2102 that multiplies an amplitude-corrected amplitude signal output from the multiplier circuit 105 by a predetermined coefficient (coeff1) in accordance with the output level of a power amplifier and outputs an amplitude signal that has been multiplied by a predetermined constant to the amplitude modulation unit 106. The predetermined constant is set based on a philosophy similar to that described in relation to the transient characteristic compensation circuit 501 in the first embodiment of the invention.

With this configuration, the polar modulation circuit according to the second embodiment of the invention is capable of reducing the capacity of data stored in memory and suppressing an increase in the circuit scale related to distortion compensation in the polar modulation system while assuring the compensation accuracy, which advantages have been unavailable so far even through any combination of related art practices.

In case the polar modulation circuit according to the second embodiment of the invention is used in a transmitter, a digital/analog converter circuit (hereinafter referred to as a D/A converter) (not shown) is arranged in each of the pre-stage of the amplitude modulation unit 106 and the pre-stage of the phase modulation unit 107.

Third Embodiment

Figure 5D:
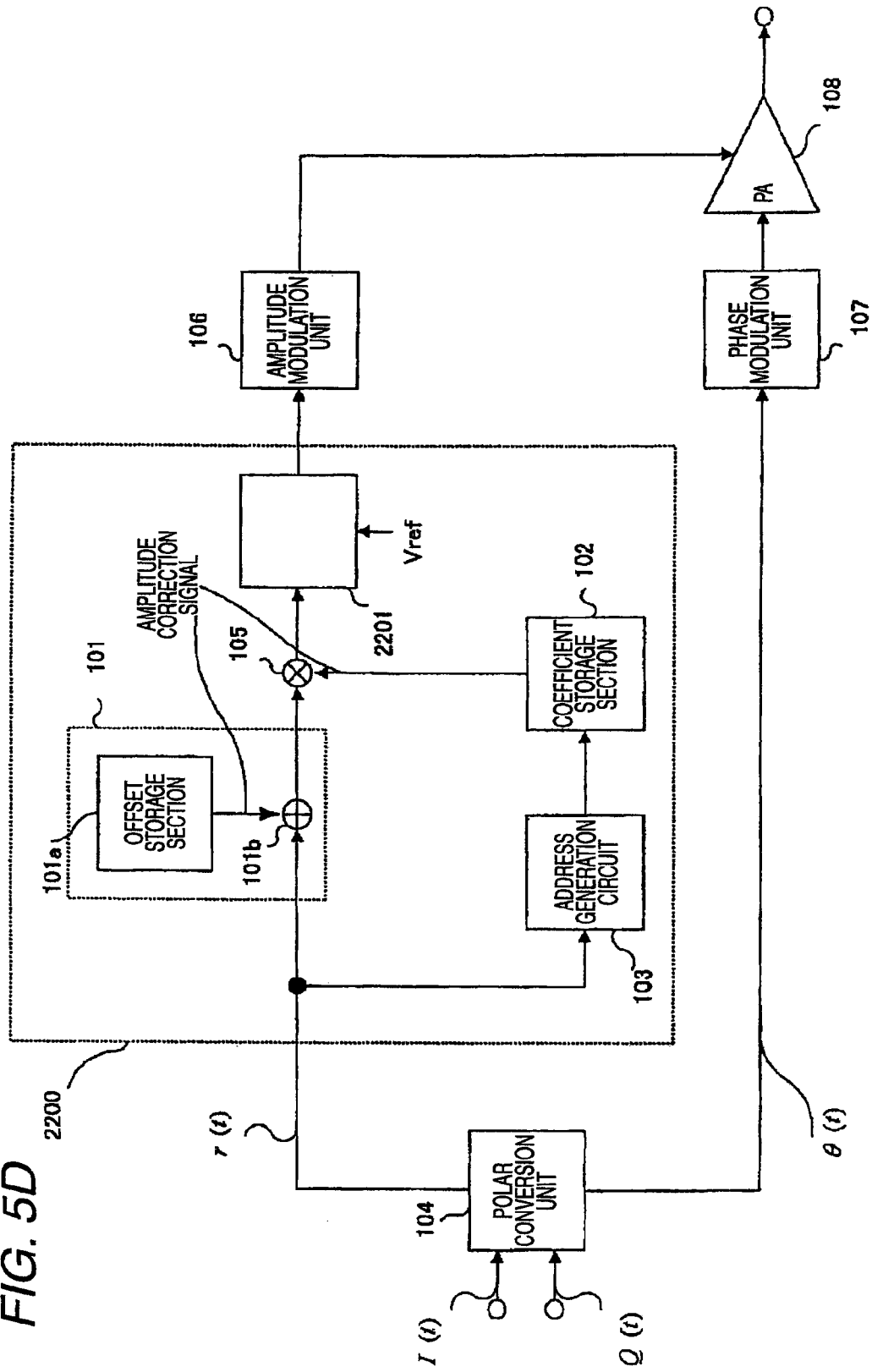
FIG. 5D It shows an example of skeleton framework of a polar modulation circuit according to the third embodiment of the invention.

A third embodiment of the invention describes a polar modulation circuit of which the circuit configuration is simplified in the polar modulation circuit shown in the second embodiment of the invention. FIG. 5D shows a skeleton framework of a polar modulation circuit according to the third embodiment of the invention. As shown in FIG. 5D, a polar modulation circuit according to the third embodiment of the invention comprises polar conversion unit 104, an AM-AM characteristic compensation circuit 2200, amplitude modulation unit 106, phase modulation unit 107, and a power amplifier 108.

The AM-AM characteristic compensation circuit 2200 includes an offset compensation circuit 101, a coefficient storage section 102, an address generation circuit 103, a multiplier circuit 105, and a multiplying DA converter (hereinafter referred to as an MDAC) 2201 and performs predetermined distortion compensation processing on amplitude information r(t). A same sign as in FIG. 5B or 5C of the second embodiment of the invention is given to a portion in FIG. 5D that is common to FIG. 5B or 5C and corresponding description is omitted.

The MDAC 2201 multiplies an amplitude-corrected amplitude signal output from the multiplier circuit 105 by a predetermined coefficient based on a reference potential (Vref) input in accordance with the output level of a power amplifier and outputs a multiplied amplitude signal by the predetermined coefficient to the amplitude modulation unit 106.

That is, the MDAC 2201 has the feature of a D/A converter arranged in case a polar modulation circuit is used in a transmitter. Further, the MDAC 2201 performs the similar operation to that of the transient characteristic compensation circuit 2101 described using FIG. 5C in the second embodiment of the invention. Thus it is possible to simplify the circuit configuration assumed in case the polar modulation circuit is used in a transmitter compared with the polar modulation circuit according to the second embodiment of the invention.

Fourth Embodiment

Figure 6:
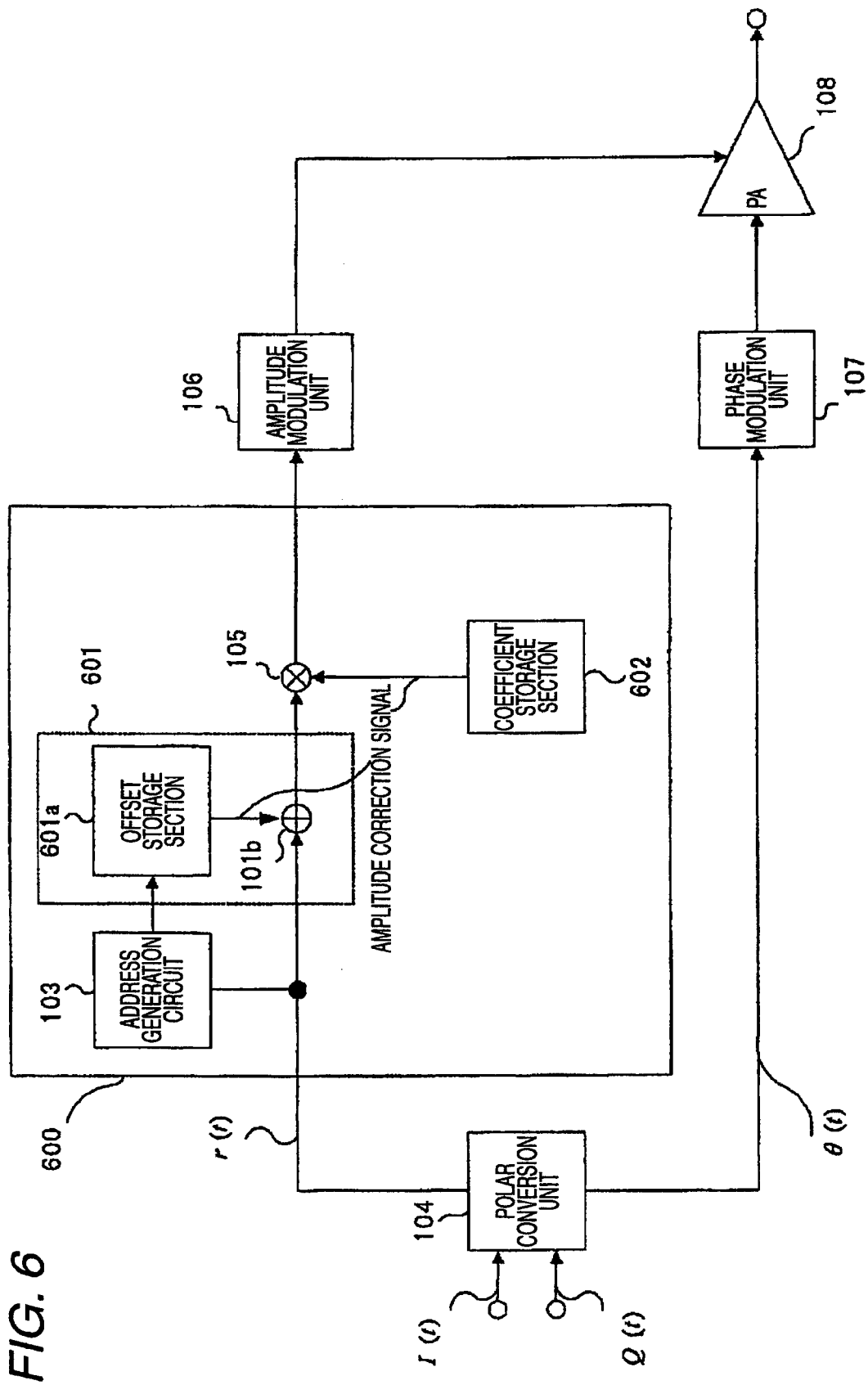
FIG. 6 It shows a skeleton framework of a polar modulation circuit according to the fourth embodiment of the invention.

FIG. 6 shows a skeleton framework of a polar modulation circuit according to the fourth embodiment of the invention. As shown in FIG. 6, a polar modulation circuit according to the fourth embodiment of the invention comprises polar conversion unit 104, an AM-AM characteristic compensation circuit 600, amplitude modulation unit 106, phase modulation unit 107, and a power amplifier 108.

The AM-AM characteristic compensation circuit 600 includes an offset compensation circuit 601, a coefficient storage section 602, an address generation circuit 103, and a multiplier circuit 105 as amplitude information correction unit and performs predetermined distortion compensation processing on amplitude information r(t). The distortion compensation processing will be detailed later. A same sign as in FIG. 1A of the first embodiment of the invention is given to a portion in FIG. 6 that is common to FIG. 1A and corresponding description is omitted.

The offset compensation circuit 601 includes an offset storage section 601*a* and an adder circuit 101*b* and selects a DC offset voltage based on an output signal from the address generation circuit 103. The offset compensation circuit 601 then applies an amplitude correction signal which a predetermined DC offset voltage stored in the offset storage section 601a to a baseband amplitude signal r(t) output from the polar conversion unit 104 and outputs the resulting signal.

The address generation circuit 103 selects an address to be output using a preset threshold (Th1) as a reference for an amplitude signal r(t) output from the polar conversion unit 104. A method for selecting the address will be detailed later.

The coefficient storage section 602 stores the inclination of a linear function that represents a linear region out of the positive characteristic of the signal amplitude characteristic (AM-AM) relative to the input control signal of the power amplifier 108 for a predetermined input high frequency signal amplitude and outputs a correction signal the inverse of the positive characteristic multiplied by a predetermined constant.

The multiplier circuit 105 corrects an output signal from the offset compensation circuit 601 based on the amplitude correction signal output from the coefficient storage section 602. In case the polar modulation circuit according to the fourth embodiment of the invention is used in a transmitter, a digital/analog converter circuit (hereinafter referred to as a D/A converter) (not shown) is arranged in each of the pre-stage of the amplitude modulation unit 106 and the pre-stage of the phase modulation unit 107.

(Distortion Compensation by the AM-AM Characteristic Compensation Circuit 600)

Figure 7:
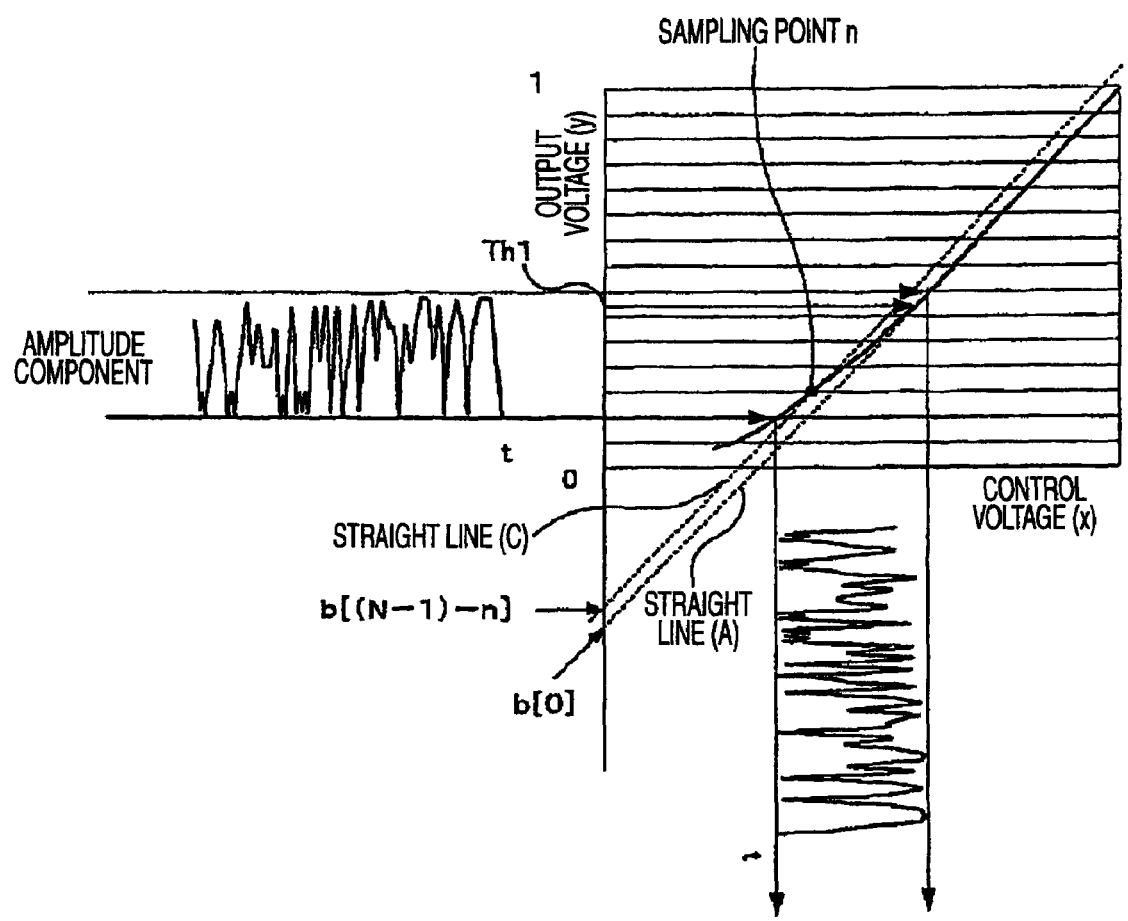
FIG. 7 It shows an example of the output signal amplitude characteristic relative to the input control signal of a power amplifier.

Next, the distortion compensation processing by the AM-AM characteristic compensation circuit 600 will be detailed. Assume that the positive characteristic of the output signal amplitude characteristic (AM-AM) relative to the input control signal of the power amplifier 108 is represented by the graph in FIG. 7. In FIG. 7, the horizontal axis represents a control voltage (x) applied to the power amplifier 108 and the vertical axis an output voltage (y) from the power amplifier 108. The curve shown by the solid line in the figure represents the output voltage characteristic of a basic frequency in the steady state obtained in case a predetermined control voltage is applied.

This characteristic is the same as that of the solid line shown in FIGS. 2, 13 and 14. A control voltage to be applied to the power amplifier 108 is obtained when an amplitude signal is represented. That is, the relationship between the control voltage to be applied to a power amplifier and the output amplitude signal is the same as that shown in FIG. 14. A straight line (A) shown by a dotted line in the figure indicates the characteristic of an extended linear region of the curve and can be represented by the expression (2) in the first embodiment of the invention.

A straight line (C) shown by a dotted line in the figure is a straight line passing through each of the sampling points of the AM-AM characteristic sampled at predetermined intervals (sampling point n where n is 0 to N−1 in ascending order of control voltage where N is the number of data points stored in memory) and having the same inclination as the straight line (A), and is represented by the expression (9). That is, the straight line (A) and the straight line (C) indicate straight lines that have an inclination in common and different intercept b[n] (n≦N−2) on the output voltage (y) axis.

[Number 7]

$$y = a[0] \times x + b[(N-1)-n] \quad (9)$$

In the fourth embodiment of the invention, same as the first embodiment of the invention, normalization is made in the polar conversion unit 104 so that the maximum value of the amplitude signal r(t) with the maximum output setting will be 1 in the setting of the output level of the power amplifier 108, and the value of the amplitude signal r(t) is multiplied by a constant smaller than 1 according to the output level when the output level is reduced. Thus, the output voltage axis shown in FIG. 7 is also normalized so that the maximum value will be 1. A symbol Th1 in FIG. 7 is a threshold set to an amplitude signal in the address generation circuit 103 and indicates the boundary line between the linear region and the nonlinear region of the AM-AM characteristic on the output voltage axis.

First, in FIG. 7, operation to obtain the inverse characteristic of the output signal amplitude characteristic (AM-AM) relative to the input control signal, that is the data for compensating the AM-AM characteristic is described taking as an example the amplitude signal shown in FIG. 11.

In the example of FIG. 7, although there is a region where the amplitude component is off the straight line (A) represented by the expression (2) in the first embodiment of the invention, assume a case where an amplitude component is in a region (r(t)≧Th1) where it can be represented by the expression (2). The inverse function of the expression (2) can be represented by the expression (4) in the first embodiment.

Considering the correspondence to FIG. 6, the amplitude signal r(t) output from the polar conversion unit 104 is y. By adding the data (−b[0]) stored in the offset storage section 601a to y in the offset compensation circuit 601 and multiplying in the multiplier circuit 105 the result by the amplitude compensation signal (1/a[0]) output from the coefficient storage section 602, it is possible to obtain x as a signal output to the amplitude modulation unit 106.

That is, the operations of the offset compensation circuit 601 for adding an offset voltage to an amplitude signal, the coefficient storage section 602 which stores an inclination, and the multiplier circuit 105 for multiplying an output signal from the offset compensation circuit 101 by a predetermined value perform AM-AM characteristic compensation on the region that can be represented by the straight line (a) of the AM-AM characteristic shown by the solid line in FIG. 7.

Next, assume a case where an amplitude component is in a region where it cannot be represented by the expression (2), that is, a nonlinear region (r(t)<Th1) is included. In this case, the inverse function of the expression (9) can be represented by the expression (10).

[Number 8]

$$x = \frac{1}{a[0]} \times \{y + (-b[(N-1)-n])\} \quad (10)$$

(Storing the Intercept of a Straight Line into the Offset Storage Section 601a)

First, concerning a method for compensating for a nonlinear region, the difference between the AM-AM characteristic compensation circuit 600 in the fourth embodiment of the invention and the related art distortion compensation circuit of the pre-distortion system described in Patent Reference 3 will be explained. The difference is that the distortion compensation circuit described in Patent Reference 3 stores the difference value between a straight line representing a linear region and a nonlinear region into the memory 1802, while the AM-AM characteristic compensation circuit 600 in the fourth embodiment of the invention represents a nonlinear region by a predetermined straight line separate from a linear region and stores the intercept of the predetermined straight line into the offset storage section 601a.

The AM-AM characteristic compensation circuit 100 according to the first embodiment of the invention represents the nonlinear region by a predetermined straight line separate from the linear region and stores the inclination of the predetermined straight line into the coefficient storage section 102. The type of data stored into a storage section is different from that in the fourth embodiment of the invention.

Assume that the storage data for a sampling point n (hereinafter referred to as the address number n) is D[n] (where n=N-1 is used to represent a linear region and n=0 to N-2 is assumed). Sampling interval for n=0 to N-2 is constant.

The distortion compensation circuit described in Patent Reference 3 stores the difference value between a straight line representing a linear region and a nonlinear region into memory. It is thus possible to represent the storage data D[n] for the address number n by the expression (5) in the first embodiment of the invention.

In the meantime, the AM-AM characteristic compensation circuit 600 in the fourth embodiment of the invention represents a nonlinear region by a predetermined straight line separate from a linear region and stores the intercept of the predetermined straight line into the offset storage section 601a. It is thus possible to represent the storage data D[n] for the address number n by the expression (11).

[Number 9]

$$D[n] = -b[(N-1)-n] \quad (11)$$

(Address Selection Method in the Address Generation Circuit 103)

An address selection method in the address generation circuit 103 will be described. FIG. 3 shows a flow of processing in the address generation circuit 103. In case the amplitude signal r(t) output from the polar conversion unit 104 is equal to or larger than the threshold (Th1), an address n=N-1 is output.

In case the amplitude signal r(t) is below the threshold (Th1), the amplitude signal r(t) is assigned to address numbers partitioned by a constant sampling interval to output the address n (n=0 to N-2). In other words, an address n corresponding to the amplitude signal is output.

Assuming that an amplitude signal corresponding to an address number (n-2) is r(n-2) and an amplitude signal corresponding to an address number (n-1) is r(n-1), only one point of compensation data to represent a linear region is required under the conditions of the expression (8) in the first embodiment of the invention. This provides the best efficiency of data storage into the offset storage section 601a.

As described so far, the AM-AM characteristic compensation circuit 600 in the fourth embodiment of the invention has an advantage like in Patent Reference 2 or Patent Reference 3 that reduces the compensation data volume compared with a case where a constant interval is used to acquire compensation data in both the linear and nonlinear regions. The AM-AM characteristic compensation circuit 600 in the fourth embodiment of the invention also has another advantage that further reduces the circuit scale because only one point of compensation data is stored into the offset storage section 601a in order to represent a linear region.

In addition, the AM-AM characteristic compensation circuit 600 in the fourth embodiment of the invention has one-time addition process and one-time multiplication process by adding the offset voltage with the offset compensation circuit 601 and storing the compensation data into the coefficient storage section 601a with the expression (11). Thus, the AM-AM characteristic compensation circuit 600 in the fourth embodiment of the invention also has other advantage that reduces counts of the calculation processing compared with the case (two-time addition process and one-time multiplication process) that applies the compensation circuit to the polar system shown in Patent Reference 3.

In the distortion compensation processing that requires real time processing of transmit data, an increase in the arithmetic operation, that is, an increase in the arithmetic time makes it difficult to apply the distortion compensation processing to cell phone services or a wireless LAN (Local Area Network) system where fast data transmission is in mainstream. Thus, the smallest volume of arithmetic operation possible is desirable and thus the AM-AM characteristic compensation circuit 600 of the invention is advantageous.

While in the fourth embodiment of the invention the coefficient storage section 602 stores a coefficient representing the positive characteristic of the output signal amplitude characteristic (AM-AM) for the input control signal of the power amplifier 108 for a predetermined input high frequency signal amplitude and outputs as an amplitude correction signal the inverse multiplied by a predetermined constant, the inverse multiplied by the predetermined constant may be obtained beforehand and the data stored into the coefficient storage section 602 may be the inverse multiplied by the predetermined constant.

While -b[(N-1)-n] is added in the offset compensation circuit 601 in the fourth embodiment of the invention, +b[(n-1)-n] may be subtracted equivalently.

While 1/a[0] is output as a amplitude correction signal from the coefficient storage section 602 and multiplication is made in the multiplier circuit 105 in the fourth embodiment of the invention, a configuration is equivalent where a divider circuit is provided instead of the multiplier circuit 105 and a[0] is output as a amplitude correction signal from the coefficient storage section 602 followed by division in the amplitude information correction unit.

The AM-AM characteristic compensation circuit 600 as a distortion compensation circuit disclosed in the fourth embodiment of the invention or polar modulation circuit may be implemented for example on a silicon semiconductor substrate and may be mounted as an integrated circuit.

Fifth Embodiment

Figure 8:
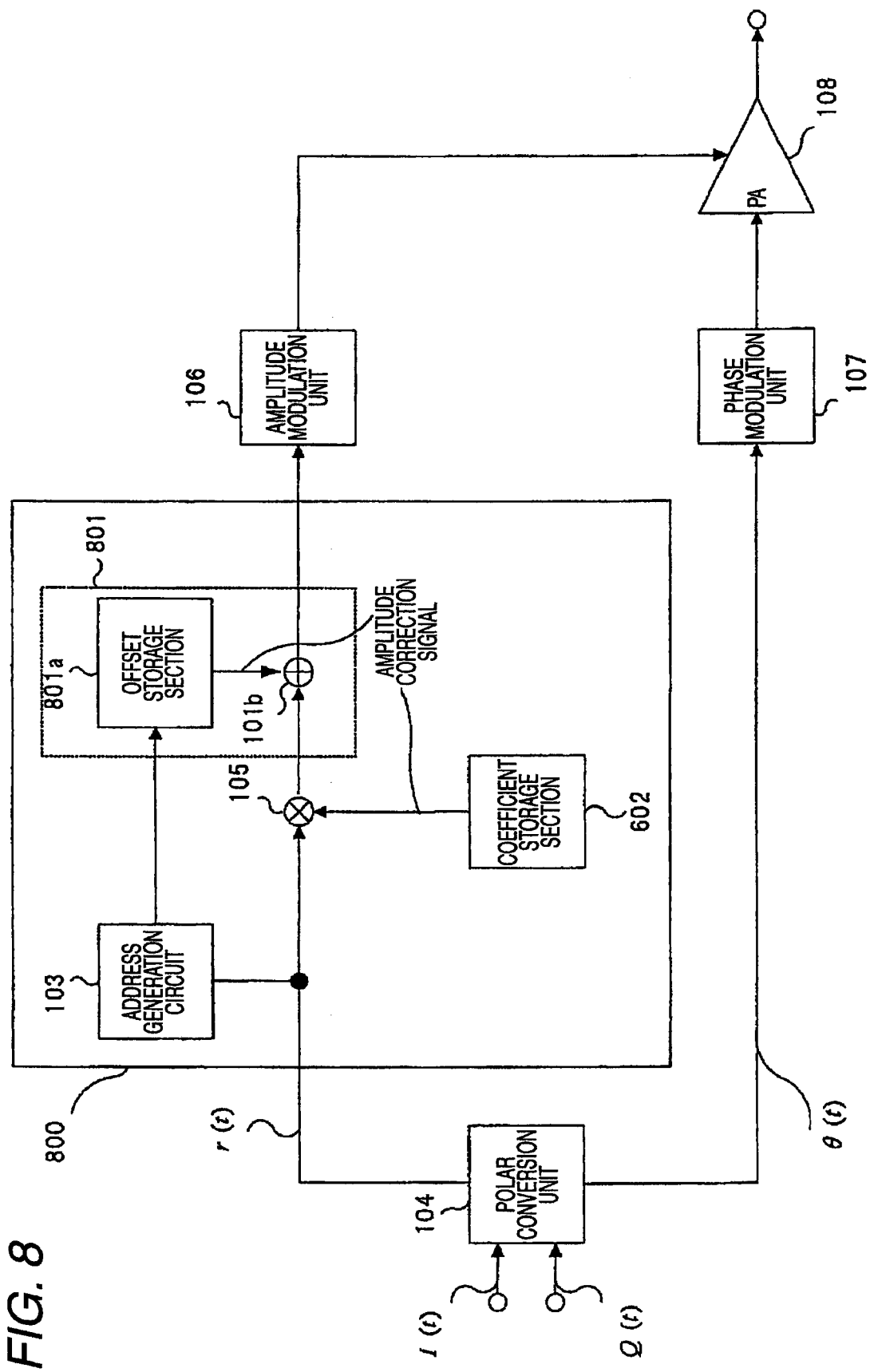
FIG. 8 It shows a skeleton framework of a polar modulation circuit according to the fifth embodiment of the invention FIG. 9 It shows an example of skeleton framework of a polar modulation circuit according to the sixth embodiment of the invention.

FIG. 8 shows a skeleton framework of a polar modulation circuit according to the fifth embodiment of the invention. As shown in FIG. 8, a polar modulation circuit according to the fifth embodiment of the invention comprises polar conversion unit 104, an AM-AM characteristic compensation circuit 800, amplitude modulation unit 106, phase modulation unit 107, and a power amplifier 108.

The AM-AM characteristic compensation circuit 800 includes an offset compensation circuit 801, a coefficient storage section 602, an address generation circuit 103, and a multiplier circuit 105 as amplitude information correction unit and performs predetermined distortion compensation processing on amplitude information r(t). The distortion compensation processing will be detailed later. A same sign as in FIG. 6 of the second embodiment of the invention is given to a portion in FIG. 8 that is common to FIG. 6.

The offset compensation circuit 801 includes an offset storage section 801a and an adder circuit 101b and selects a DC offset voltage based on an output signal from the address generation circuit 103. The offset compensation circuit 801 then applies signal a predetermined DC offset voltage stored in the offset storage section 801a as an amplitude correction to a baseband amplitude signal r(t) output from the polar conversion unit 104 and outputs the resulting signal.

Data in the form represented by the expression (12) is stored as storage data D[n] for the address number n into the offset storage section 801a (n=0 to N−1)

[Number 10]

$$D[n] = -\frac{b[(N-1)-n]}{a[0]} \quad (12)$$

Assuming that the amplitude signal r(t) output from the polar conversion unit 104 is y, the inverse 1/a[0] of the coefficient a[0] stored into the coefficient storage section 602 is used for multiplication in the multiplier circuit 105. Then, the data represented by the expression (12) stored in the offset storage section 801a is added. The signal assumed as x output from the offset compensation circuit 801 to the amplitude modulation unit 106 is represented by the expression (10). This signal is equivalent to a signal output from the offset compensation circuit 601 to the amplitude modulation unit 106 in the second embodiment of the invention and undergoes desired compensation for the AM-AM characteristic by the offset compensation circuit 801. The operation and working effect of the other components is similar to those described in the second embodiment of the invention and the corresponding description is omitted.

The AM-AM characteristic compensation circuit 800 as a distortion compensation circuit disclosed in the fifth embodiment of the invention or polar modulation circuit may be implemented for example on a silicon semiconductor substrate and may be mounted as an integrated circuit.

To represent a change in the inclination of the AM-AM characteristic in accordance with the environmental temperature in a polar modulation circuit according to any one of the first through fifth embodiments of the invention, a DC offset voltage stored into an offset storage section, a coefficient stored into a coefficient storage section, a coefficient used for multiplication in a transient characteristic compensation circuit or a reference potential to be supplied to MDAC should be prepared as table data for each environmental temperature. In case a polar modulation circuit according to the invention is used in a transmitter, by selecting table data as required in accordance with a temperature information from a temperature sensor (not shown) or such as a consumption current information, which is equivalent to the temperature information, from a circuit for monitoring the consumption current of a power amplifier (such as a collector current or a drain current), the anti-temperature characteristic can be improved.

Sixth Embodiment

Figure 9:
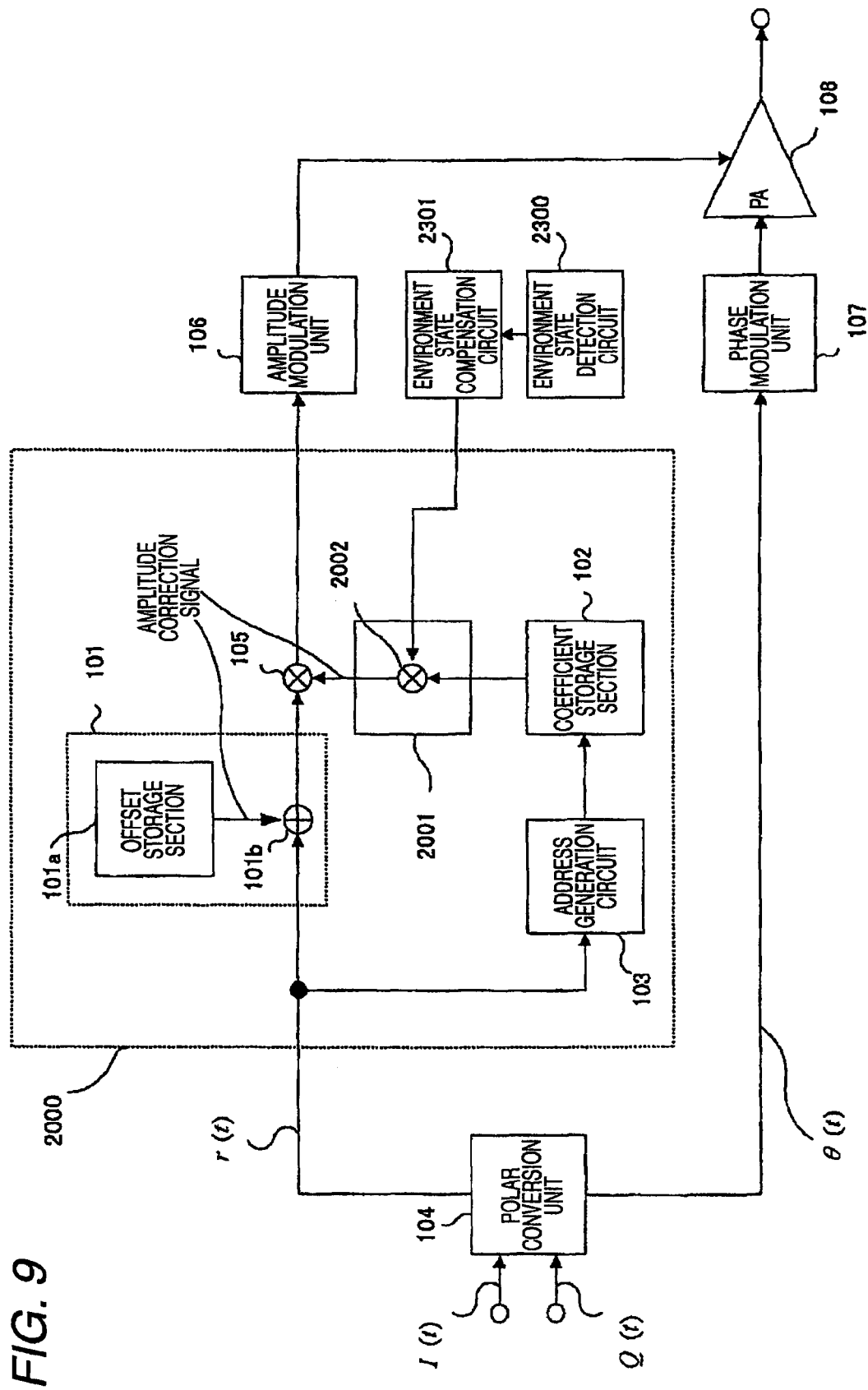
Figure 10:
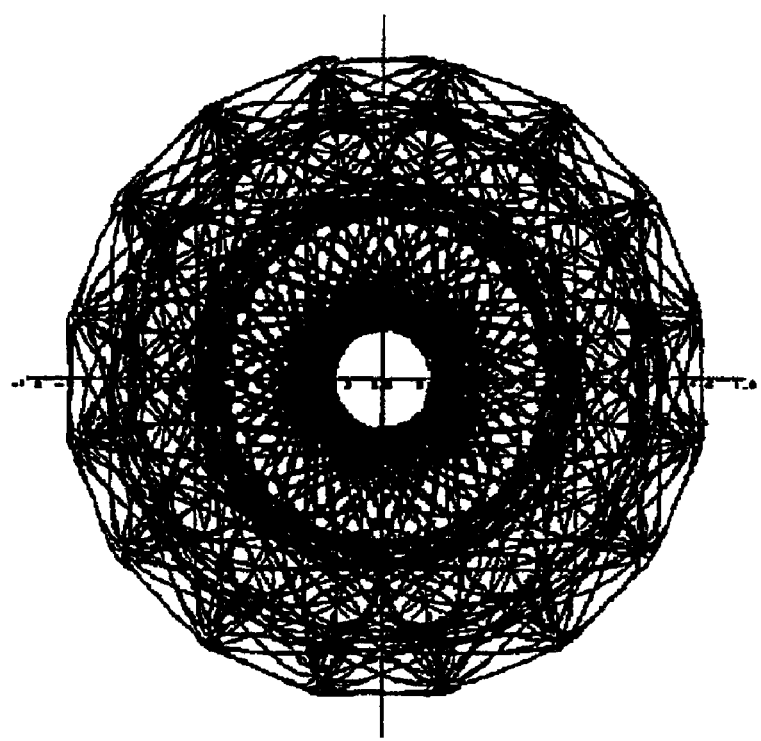
FIG. 10 It shows an 8-PSK modulation signal used in the related art EDGE system plotted on the IQ orthogonal coordinates.

FIG. 9 shows a skeleton framework of a polar modulation circuit according to the sixth embodiment of the invention. The polar modulation circuit according to this embodiment is a polar modulation circuit capable of adjusting a DC offset or a coefficient in accordance with the environment state to compensate for the environment state.

As shown in the same figure, a polar modulation circuit according to the sixth embodiment of the invention comprises polar conversion unit 104, an AM-AM characteristic compensation circuit 2000, amplitude modulation unit 106, phase modulation unit 107, a power amplifier 108, an environment state detection section 2300 for detecting the environmental temperature or consumption current of the power amplifier 108 or the like, and an environment state compensation circuit 2301 for compensating for an amplitude correction signal in accordance with a detection signal in the environment state detection section 2300.

The AM-AM characteristic compensation circuit 2000 includes an offset compensation circuit 101, a coefficient storage section 102, an address generation circuit 103, a transient characteristic compensation circuit 2001, and a multiplier circuit 105 and performs predetermined distortion compensation processing on amplitude information r(t). A same sign as in FIG. 1A of the first embodiment of the invention is given to a portion in FIG. 9 that is common to FIG. 1A and the corresponding description is omitted.

The transient characteristic compensation circuit 2001 includes a multiplier circuit 2002 that multiplies a second amplitude correction signal output from the coefficient storage section 102 by a predetermined constant in accordance with a compensation signal from the environment state compensation circuit 2301 and outputs a third amplitude correction signal that has been multiplied by a predetermined constant multiplication to the multiplier circuit 105. The predetermined constant is set in correspondence to for example a change in the inclination of an AM-AM characteristic curve.

With this configuration, the polar modulation circuit according to the sixth embodiment of the invention is capable of reducing the capacity of data stored in memory and suppressing an increase in the circuit scale related to distortion compensation in the polar modulation system as well as compensating for a change in the environment state while assuring the compensation accuracy, which advantages have been unavailable so far even through any combination of related art practices.

While FIG. 9 shows a circuit configuration that adjusts a coefficient in accordance with a detection signal in the environment state detection section 2300, a configuration is possible where for example an offset value is stored in the offset storage section 101a corresponding to a change in the offset voltage of the AM-AM characteristic curve assumed when the temperature is varying and a predetermined offset value is added to an amplitude signal r(t) in accordance with a compensation signal output from the environment state compensation circuit 2301. With this configuration, it is possible to adjust a DC offset in accordance with the environment state.

By way of a combination of adjustment of a coefficient in accordance with the environment state and adjustment of a DC offset in accordance with the environment state, it is possible to compensate for a change in the characteristic more accurately assumed when the environment state is varying.

While the invention has been described in detail and referring to specific embodiments, those skilled in the art will recognize that various changes and modifications can be made in it without departing the spirit and scope thereof.

This application is based on Japanese Patent Application (JP-A-2005-128207) filed Apr. 26, 2005 and Japanese Patent Application (JP-A-2006-108997) filed Apr. 11, 2006 and the content thereof is herein incorporated as a reference.

INDUSTRIAL APPLICABILITY

The polar modulation circuit according to the invention is capable of reducing the capacity of data stored in memory and suppressing an increase in the circuit scale related to distortion compensation while assuring the compensation accuracy and is useful as a polar modulation circuit or the like including a distortion compensation circuit of the pre-distortion system.

The invention claimed is:

1. A polar modulation circuit, comprising:
a phase modulation section which generates a phase modulation signal based on a signal having at least a phase component in a baseband orthogonal signal generated from transmit data;
an offset storage section which stores a DC offset of an output signal characteristic (AM-AM characteristic) relative to a control voltage in a steady state of an amplifier driven with a predetermined input high frequency signal amplitude value and a predetermined control voltage value;
a coefficient storage section which stores a coefficient of the output signal characteristic;
a first arithmetic circuit which adds or subtracts the DC offset stored in the offset storage section to/from an amplitude component of the baseband orthogonal signal;
a second arithmetic circuit which multiplies or divides an output signal from the first arithmetic circuit by the coefficient stored in the coefficient storage section;
an amplitude modulation section which generates an amplitude modulation signal based on an output signal from the second arithmetic circuit; and
an amplifying section which synthesizes distortion-corrected transmit data by inputting the phase modulation signal as an input high frequency signal and inputting the amplitude modulation signal as a control signal.

2. The polar modulation circuit according to claim 1, wherein:
the coefficient storage section stores inclinations of respective linear functions as the coefficients; and
the linear functions are approximated with an intercept fixed as the DC offset.

3. The polar modulation circuit according to claim 2, further comprising: an address generation circuit which generates an address signal for specifying an address in the coefficient storage section in which the coefficients corresponding to the amplitudes of the baseband orthogonal signal are stored, wherein:
the address generation circuit specifies a fixed address in a case that an amplitude of the baseband orthogonal signal represents linear region of the output signal characteristic.

4. The polar modulation circuit according to claim 1, wherein:
the offset storage section stores intercepts of respective linear functions as the DC offset; and
the linear functions are approximated with an inclination fixed as the coefficient.

5. The polar modulation circuit according to claim 4, further comprising: an address generation circuit which generates an address signal for specifying an address in the coefficient storage section in which the DC offset corresponding to the amplitude of the baseband orthogonal signal is stored, wherein
the address generation circuit specifies a fixed address in a case that an amplitude of the baseband orthogonal signal represents linear region of the output signal characteristic.

6. The polar modulation circuit according to claim 1, further comprising:
a transient characteristic compensation circuit which compensates for a transient response caused by amplitude modulation of the amplifying section by adjusting the coefficient stored in the coefficient storage section.

7. The polar modulation circuit according to claim 6, wherein
the transient characteristic compensation circuit includes a multiplier circuit which multiplies the coefficient stored in the coefficient storage section by a predetermined value.

8. The polar modulation circuit according to claim 7, wherein
the transient characteristic compensation circuit selects the predetermined value used for multiplication in the multiplier circuit in accordance with a transmit output power of the amplifying section.

9. The polar modulation circuit according to claim 7, wherein:
the transient characteristic compensation circuit selects the predetermined value used for multiplication in the multiplier circuit in accordance with a root-mean-square value of the amplitude modulation signal.

10. The polar modulation circuit according to claim 7, further comprising:
an environment state detection section which detects an environment state; and
an environment state compensation circuit which adjusts the DC offset or the coefficient in accordance with a detection signal output from the environment state detection section.

11. The polar modulation circuit according to claim 10, wherein:
the environment state compensation circuit includes a data table which retains the DC offset stored in the offset storage section, the coefficient stored in the coefficient storage section, the coefficient used for multiplication in the transient characteristic compensation circuit, or a reference potential to be supplied to the multiplying digital/analog conversion circuit for the each environment state.

12. The polar modulation circuit according to claim 11, wherein:
the environment state compensation circuit selects the DC offset, the coefficient, the multiplication coefficient or the reference potential retained in the data table in accordance with the detection signal output from the environment state detection section.

13. The polar modulation circuit according to claim 10, wherein:
the environment state detection section detects consumption current of the amplifying section.

14. The polar modulation circuit according to claim 10, wherein the environment state detection section detects an environmental temperature.

15. The polar modulation circuit according to claim 6, wherein
the transient characteristic compensation circuit includes a multiplier circuit which multiplies an input signal to the amplitude modulation section by a predetermined value.

16. The polar modulation circuit according to claim 6, wherein:
the transient characteristic compensation circuit includes a multiplying digital/analog conversion circuit which multiplies an input signal to the amplitude modulation section by a predetermined value.

17. The polar modulation circuit according to claim 16, wherein:
the transient characteristic compensation circuit selects a reference potential of the multiplying digital/analog conversion circuit in accordance with a transmit output power of the amplifying section.

18. An integrated circuit comprising the polar modulation circuit according to claim 1.

19. A radio apparatus comprising the polar modulation circuit according to claim 1.

20. A polar modulation circuit, comprising:
a phase modulation section which generates a phase modulation signal based on a signal having at least a phase component in a baseband orthogonal signal generated from transmit data;
an offset storage section which stores a DC offset of an output signal characteristic (AM-AM characteristic) relative to a control voltage in a steady state of an amplifier driven with a predetermined input high frequency signal amplitude value and a predetermined control voltage value;
a coefficient storage section which stores a coefficient of the output signal characteristic;
a first arithmetic circuit which multiplies or divides an amplitude component of the baseband orthogonal signal by the coefficient stored in the coefficient storage section;
a second arithmetic circuit which adds or subtracts the DC offset stored in the offset storage section to/from an output signal from the first arithmetic circuit;
an amplitude modulation section which generates an amplitude modulation signal based on an output signal from the second arithmetic circuit; and
an amplifying section which synthesizes distortion-corrected transmit data by inputting the phase modulation signal as an input high frequency signal and inputting the amplitude modulation signal as a control signal.

* * * * *